United States Patent
Seliskar

(10) Patent No.: US 7,714,384 B2
(45) Date of Patent: May 11, 2010

(54) CASTELLATED GATE MOSFET DEVICE CAPABLE OF FULLY-DEPLETED OPERATION

(76) Inventor: John J. Seliskar, 1410 Minor Ridge Ct., Charlottesville, VA (US) 22901

( * ) Notice: Subject to any disclaimer, the term of this patent is extended or adjusted under 35 U.S.C. 154(b) by 0 days.

(21) Appl. No.: 11/796,652

(22) Filed: Apr. 27, 2007

(65) Prior Publication Data

US 2007/0221992 A1     Sep. 27, 2007

Related U.S. Application Data

(63) Continuation-in-part of application No. 10/940,093, filed on Sep. 13, 2004, now Pat. No. 7,211,864.

(51) Int. Cl.
*H01L 29/94* (2006.01)

(52) U.S. Cl. .............. 257/331; 257/E21.629; 257/E21.633; 257/E21.643; 438/154; 438/157

(58) Field of Classification Search .......... 438/270, 438/271, 164, 298, 154, 157; 257/287, 331, 257/373, 376, 398, E21.618, E21.629, E21.633, 257/E21.643

See application file for complete search history.

(56) References Cited

U.S. PATENT DOCUMENTS

| | | | |
|---|---|---|---|
| 4,393,391 | A | 7/1983 | Blanchard |
| 4,583,107 | A | 4/1986 | Clarke |
| 5,675,164 | A | 10/1997 | Brunner et al. |
| 5,801,417 | A | 9/1998 | Tsang et al. |
| 5,932,911 | A | 8/1999 | Yeu et al. |
| 6,111,296 | A | 8/2000 | Yamazaki et al. |
| 6,118,161 | A | 9/2000 | Chapman et al. |
| 6,127,702 | A | 10/2000 | Yamazaki et al. |
| 6,198,141 | B1 | 3/2001 | Yamazaki et al. |
| 6,207,511 | B1 | 3/2001 | Chapman et al. |

(Continued)

FOREIGN PATENT DOCUMENTS

EP     1091413 A2     4/2001

(Continued)

OTHER PUBLICATIONS http://dictionary.reference.com/browse/degenerate.*

(Continued)

*Primary Examiner*—Julio J Maldonado

(57) ABSTRACT

A castellated-gate MOSFET I/O device capable of fully depleted operation is disclosed. The device includes a semiconductor substrate region having an upper portion with a top surface and a lower portion with a bottom surface. A source region and a drain region are formed in the semiconductor substrate region, and a channel-forming region is also disposed therein between the source and drain regions. Trench isolation insulator islands, having upper and lower surfaces, surround the source and drain regions as well as the channel-forming region. The channel-forming region includes a plurality of thin, spaced, vertically-orientated conductive channel elements that span longitudinally along the device between the source and drain regions. A gate structure is provided in the form of a plurality of spaced, castellated gate elements interposed between the channel elements, and a top gate member interconnects the gate elements at their upper vertical ends to cover the channel elements. The conductive channel elements are super-self-aligned from the gate structure to the source and drain regions. Finally, a dielectric layer separates the conductive channel elements from the gate structure.

7 Claims, 23 Drawing Sheets

U.S. PATENT DOCUMENTS

| | | | |
|---|---|---|---|
| 6,355,532 B1 * | 3/2002 | Seliskar et al. | 438/283 |
| 6,396,108 B1 | 5/2002 | Krivokapic et al. | |
| 6,413,802 B1 | 7/2002 | Hu et al. | |
| 6,436,798 B2 * | 8/2002 | Fu | 438/524 |
| 6,586,311 B2 * | 7/2003 | Wu | 438/382 |
| 6,642,090 B1 | 11/2003 | Fried et al. | |
| 6,649,983 B2 * | 11/2003 | Chatterjee | 257/370 |
| 6,720,619 B1 | 4/2004 | Chen et al. | |
| 6,770,535 B2 * | 8/2004 | Yamada et al. | 438/270 |
| 6,914,295 B2 | 7/2005 | Chau et al. | |
| 7,052,964 B2 * | 5/2006 | Yeo et al. | 438/296 |
| 7,211,864 B2 * | 5/2007 | Seliskar | 257/347 |
| 2007/0026629 A1 | 2/2007 | Chen et al. | |

OTHER PUBLICATIONS http://thesaurus.reference.com/browse/degenerate.*
http://dictionary.reference.com/browse/retrograde.*
Wolf et al., Silicon Processing for the VLSI Era, vol. 1: Process Technology, 1986 by Lattice Press, pp. 285-286.*
Wolf et al., Silicon Processing for the VLSI Era, vol. 1: Process Technology, 1986 by Lattice Press, pp. 285-286.*

* cited by examiner

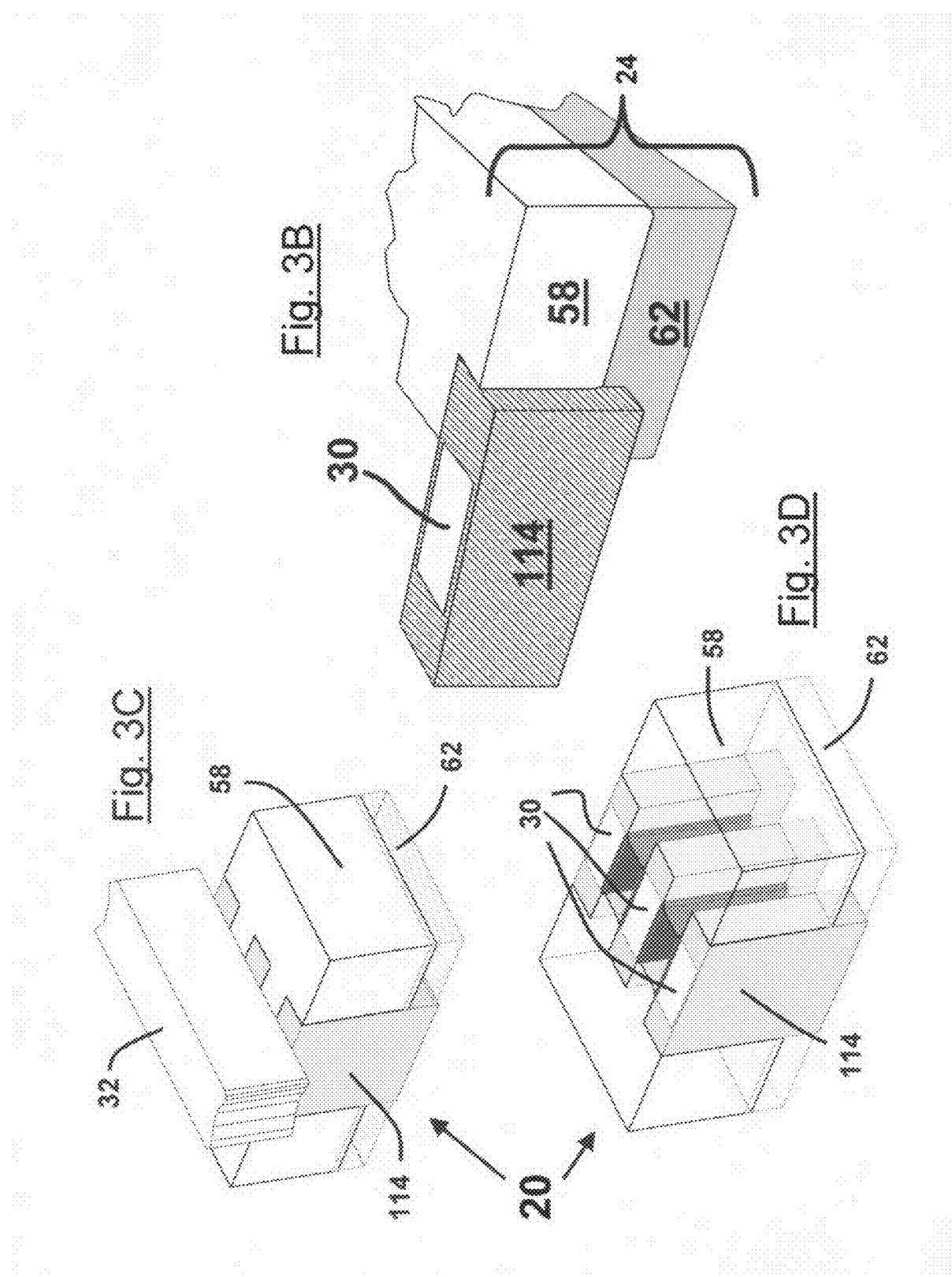

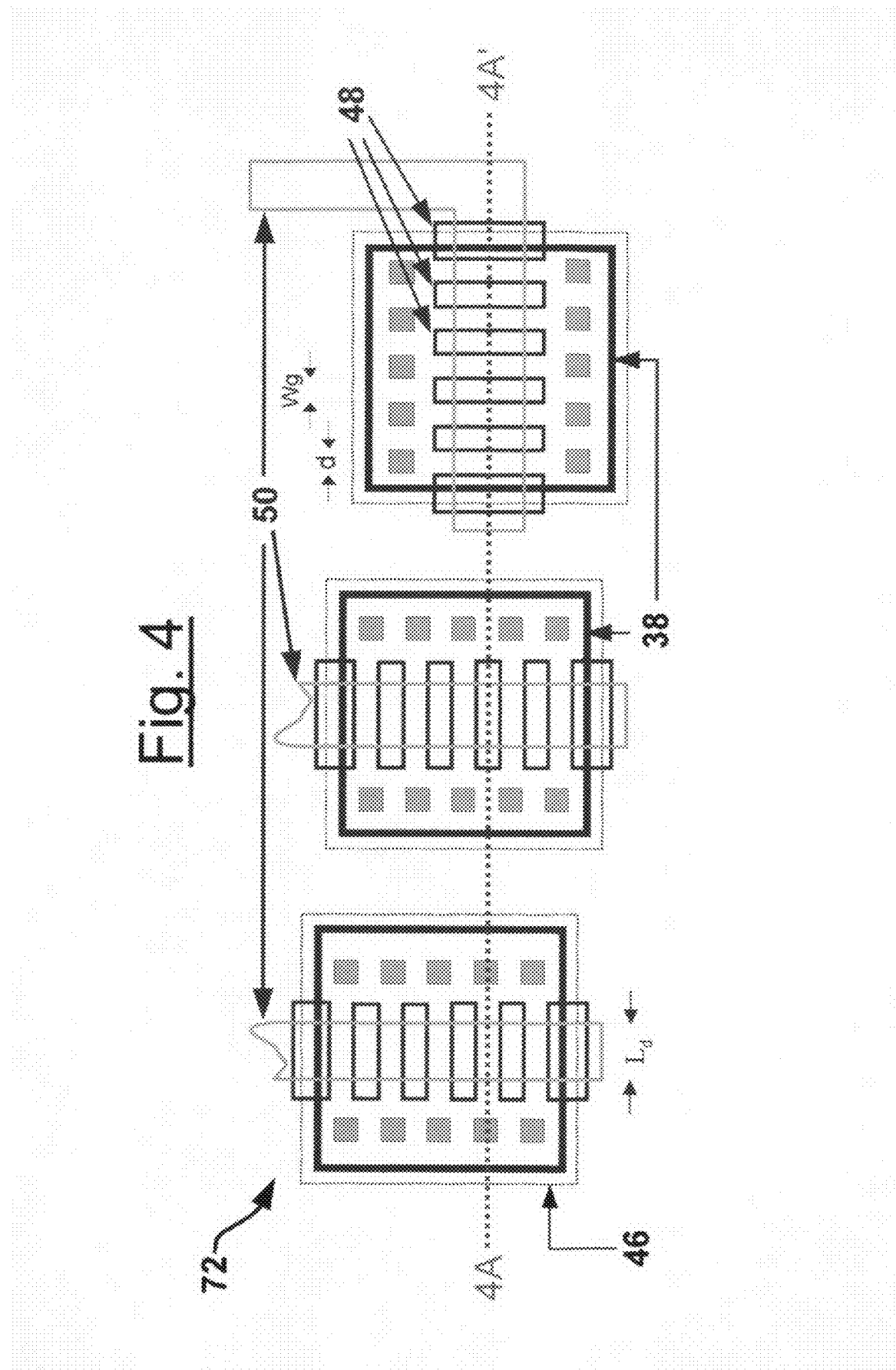

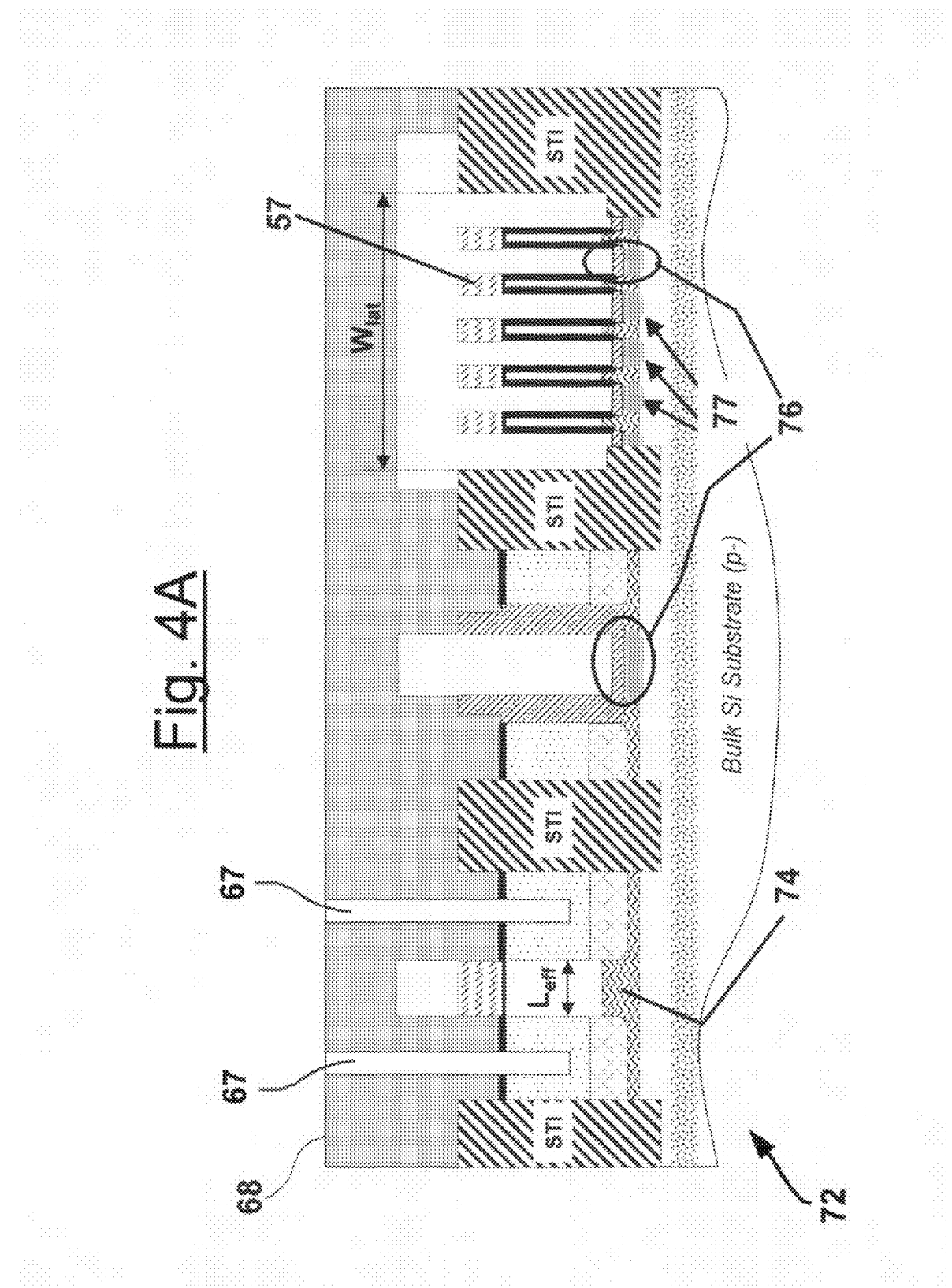

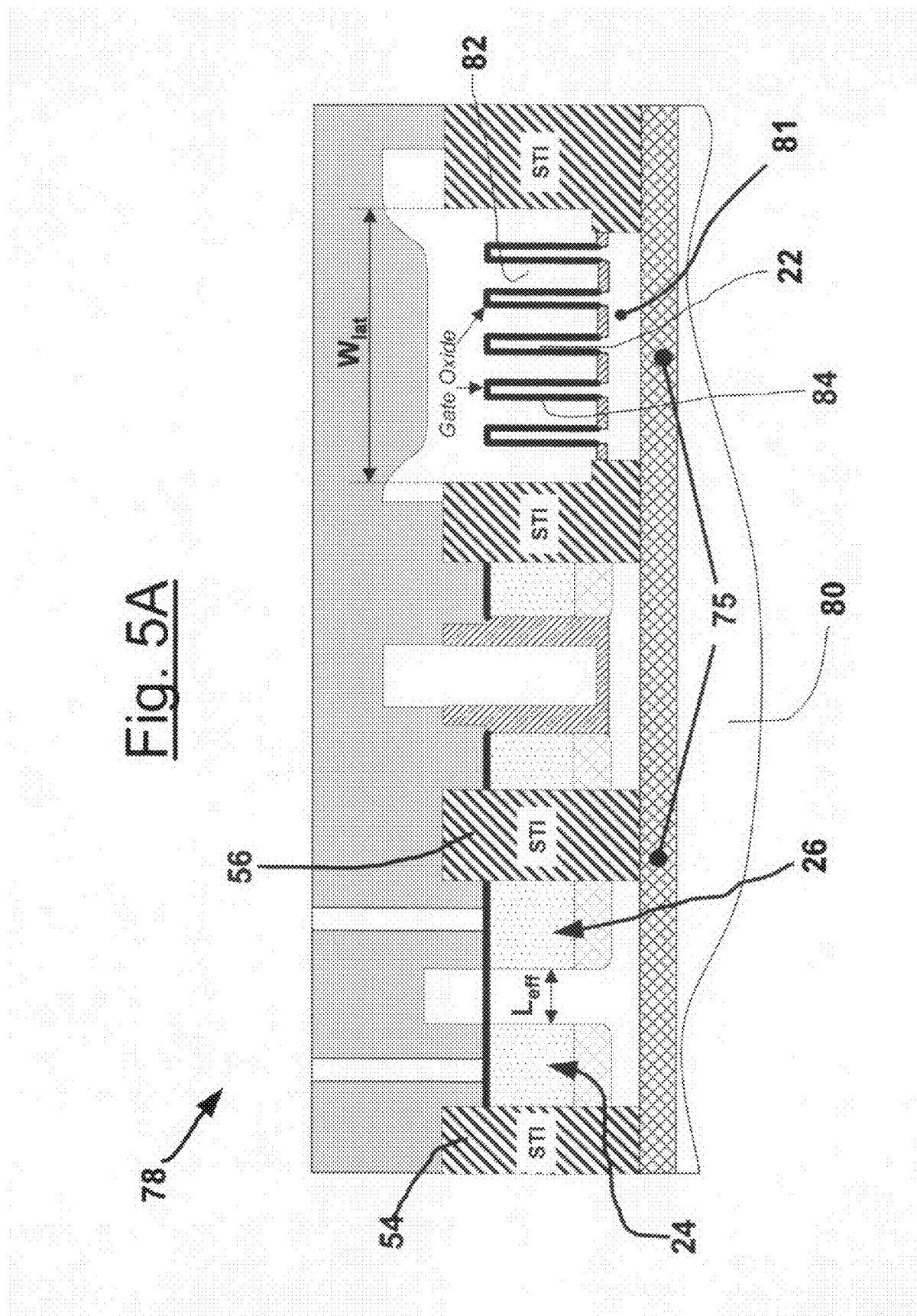

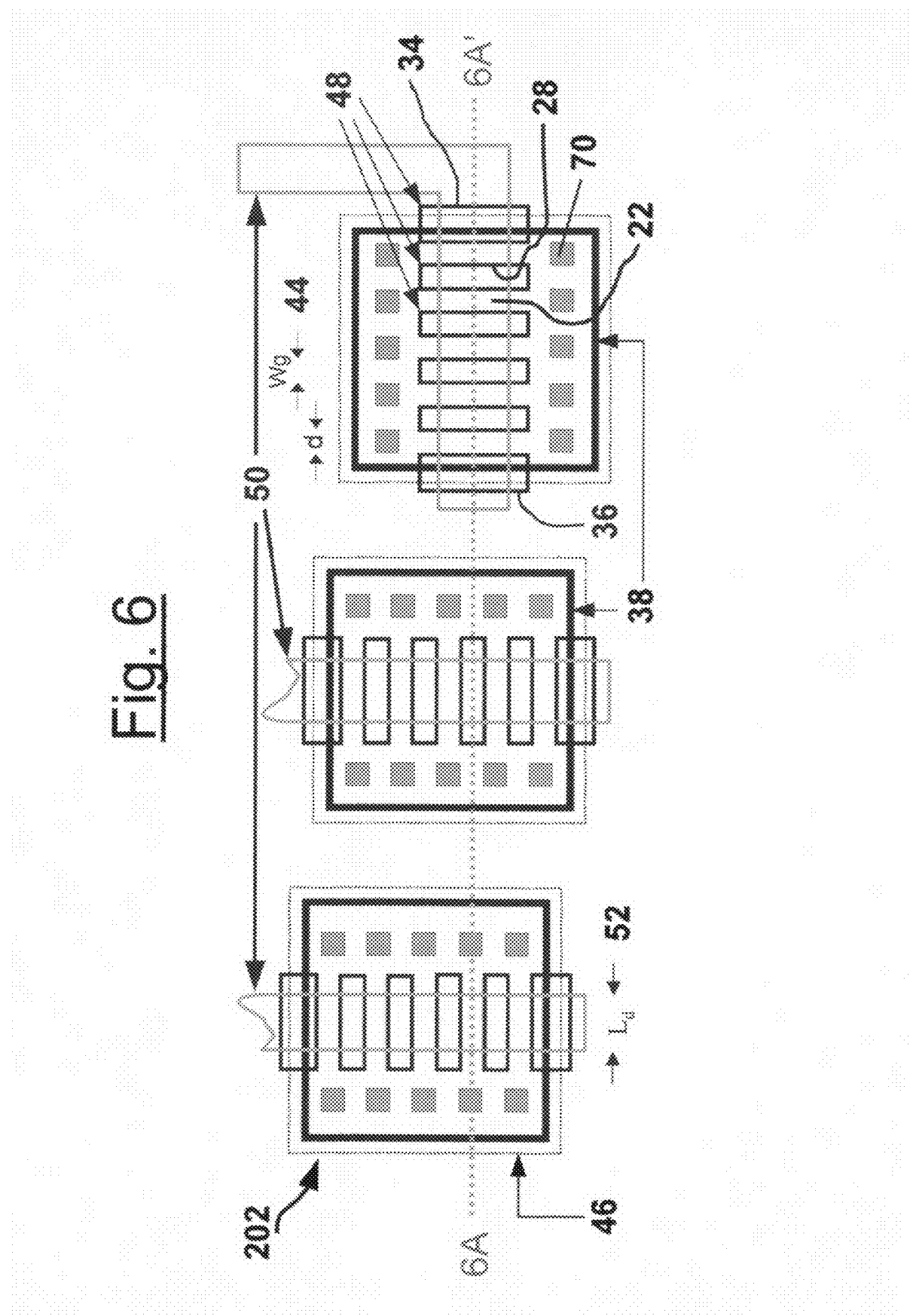

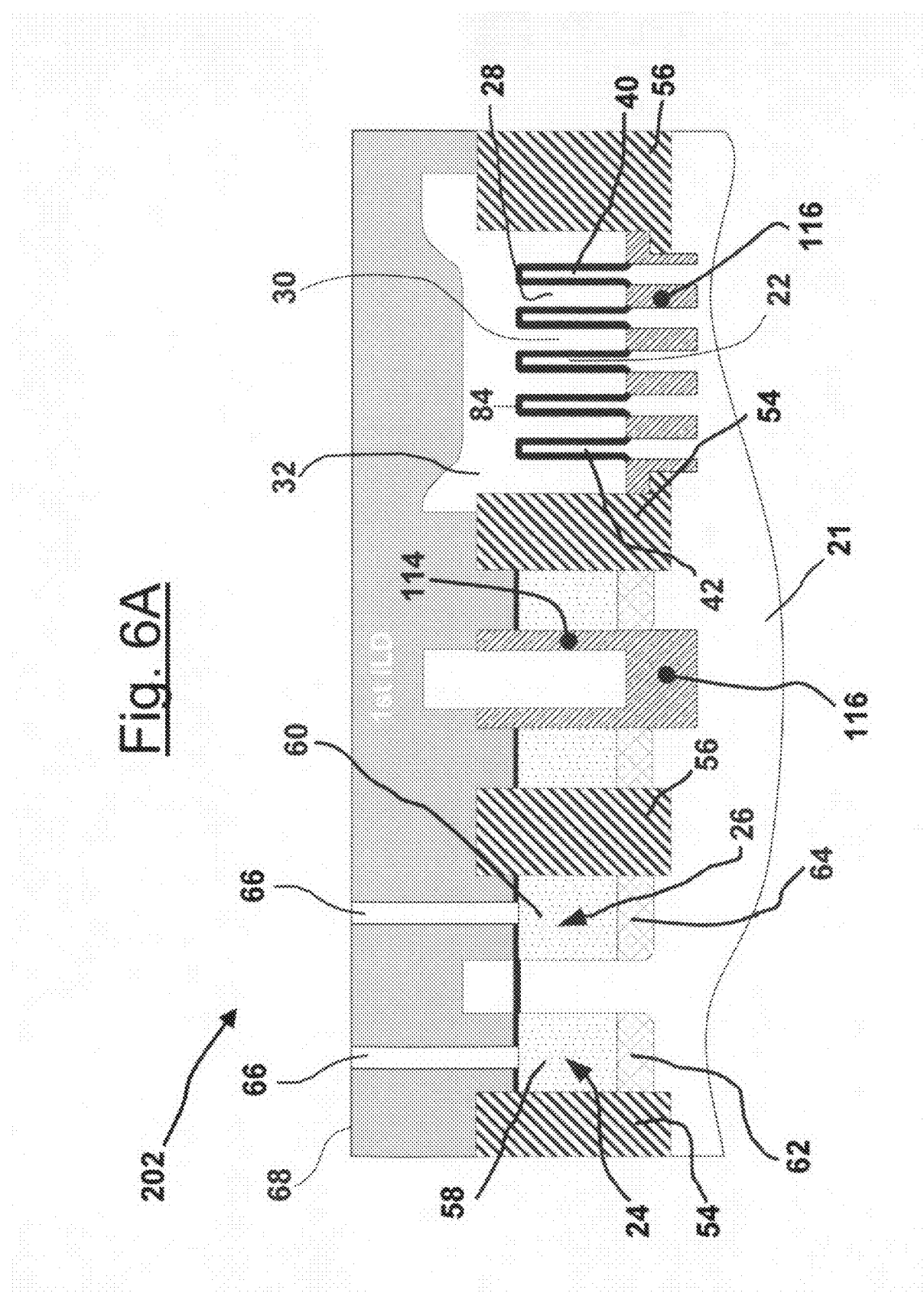

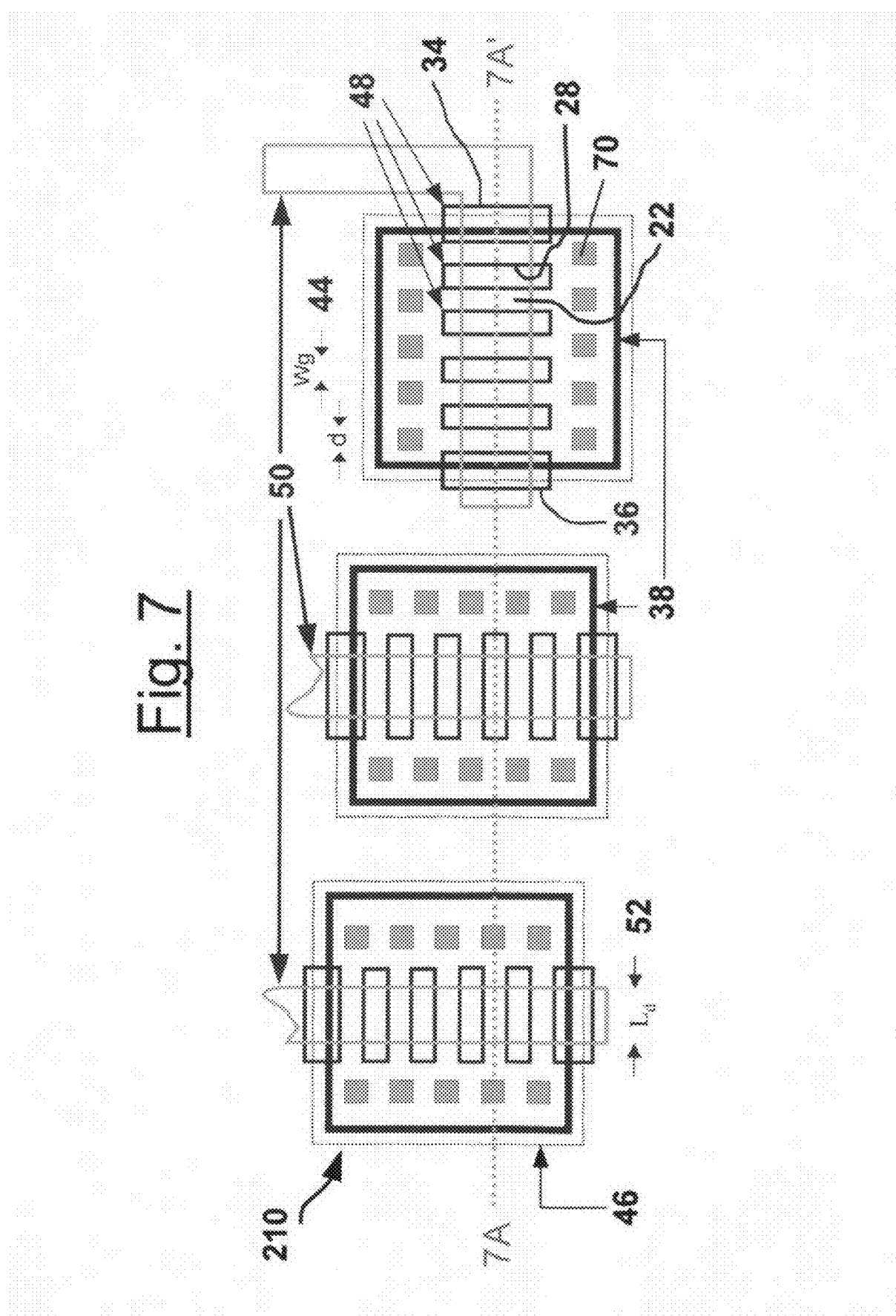

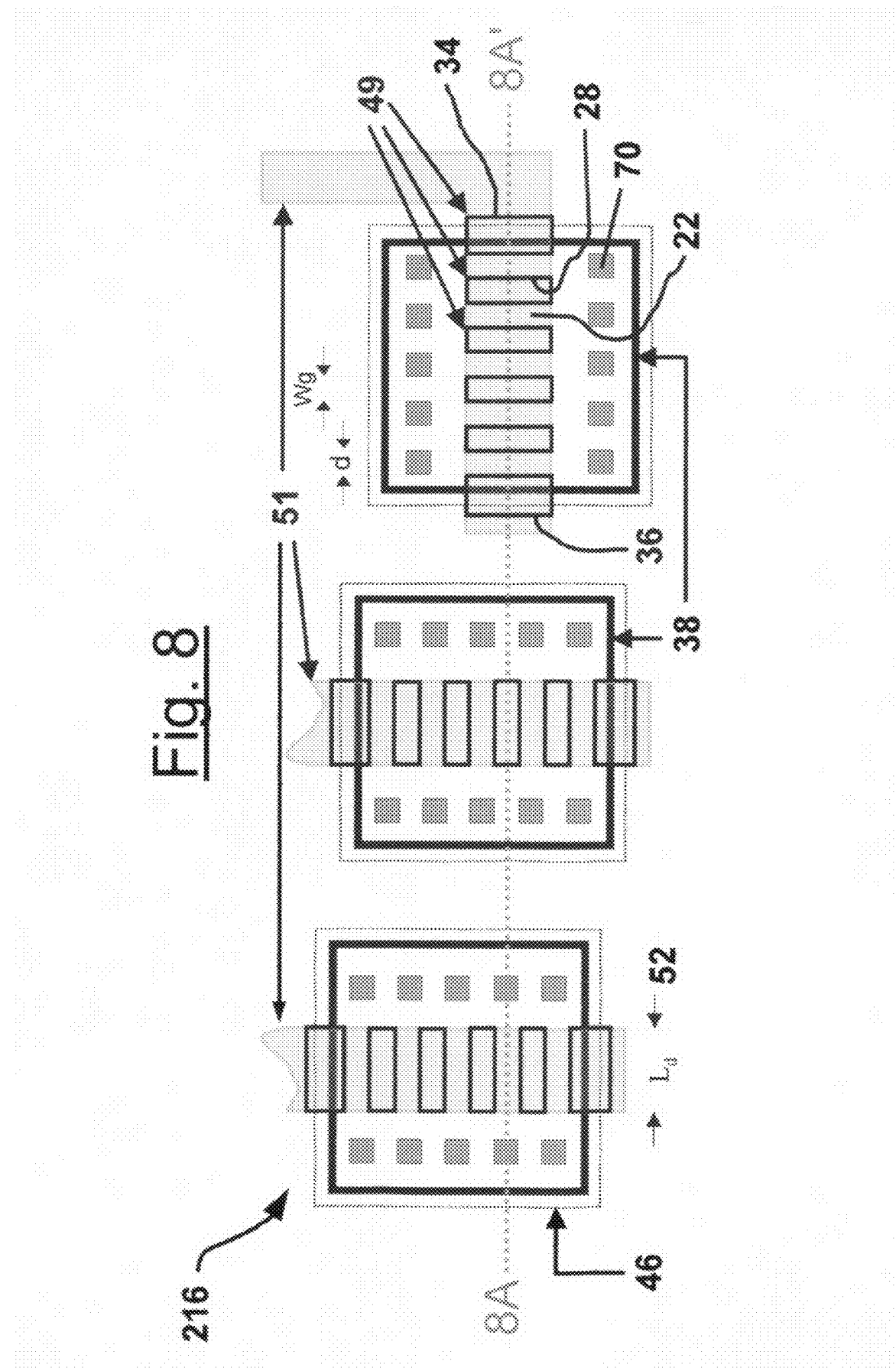

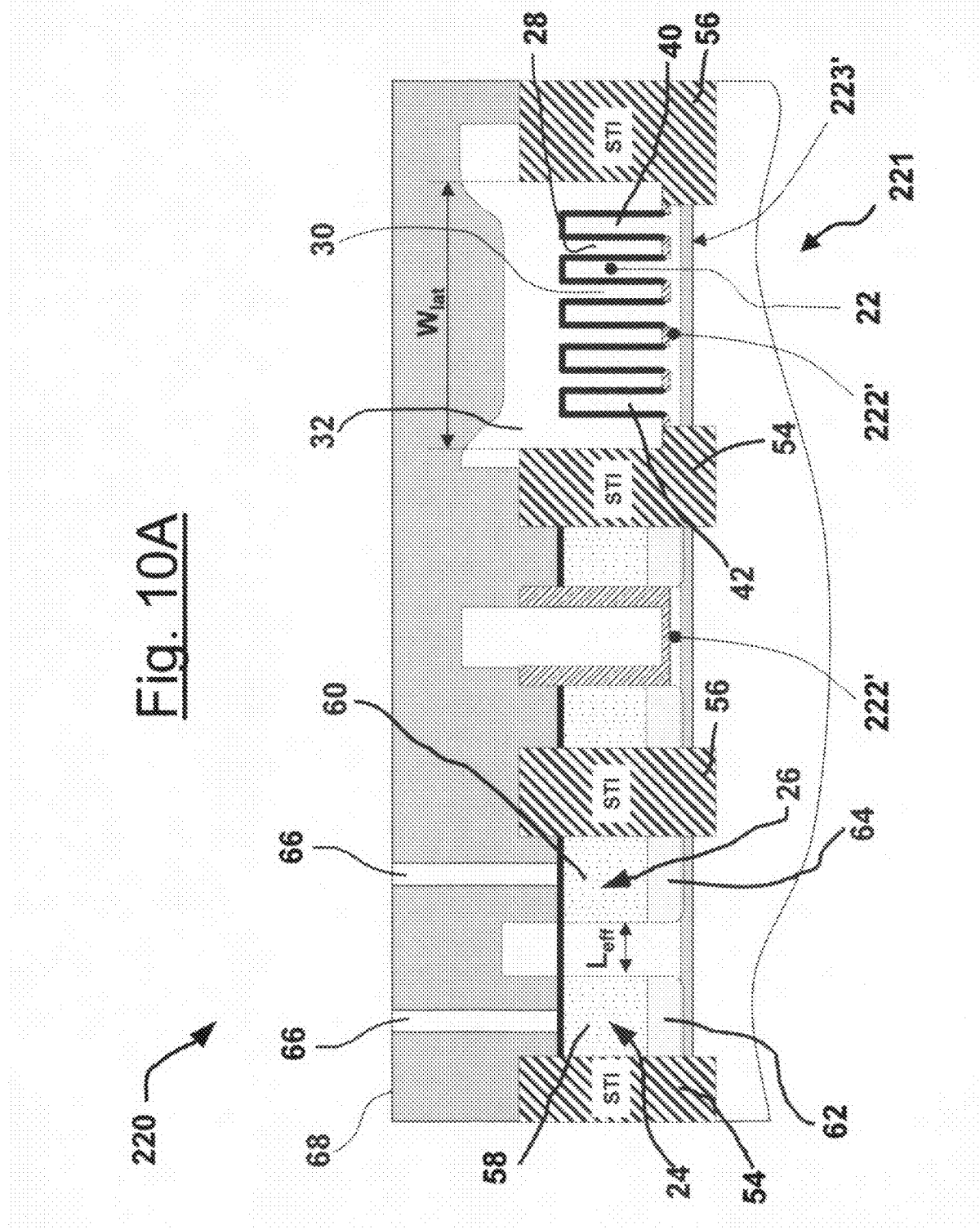

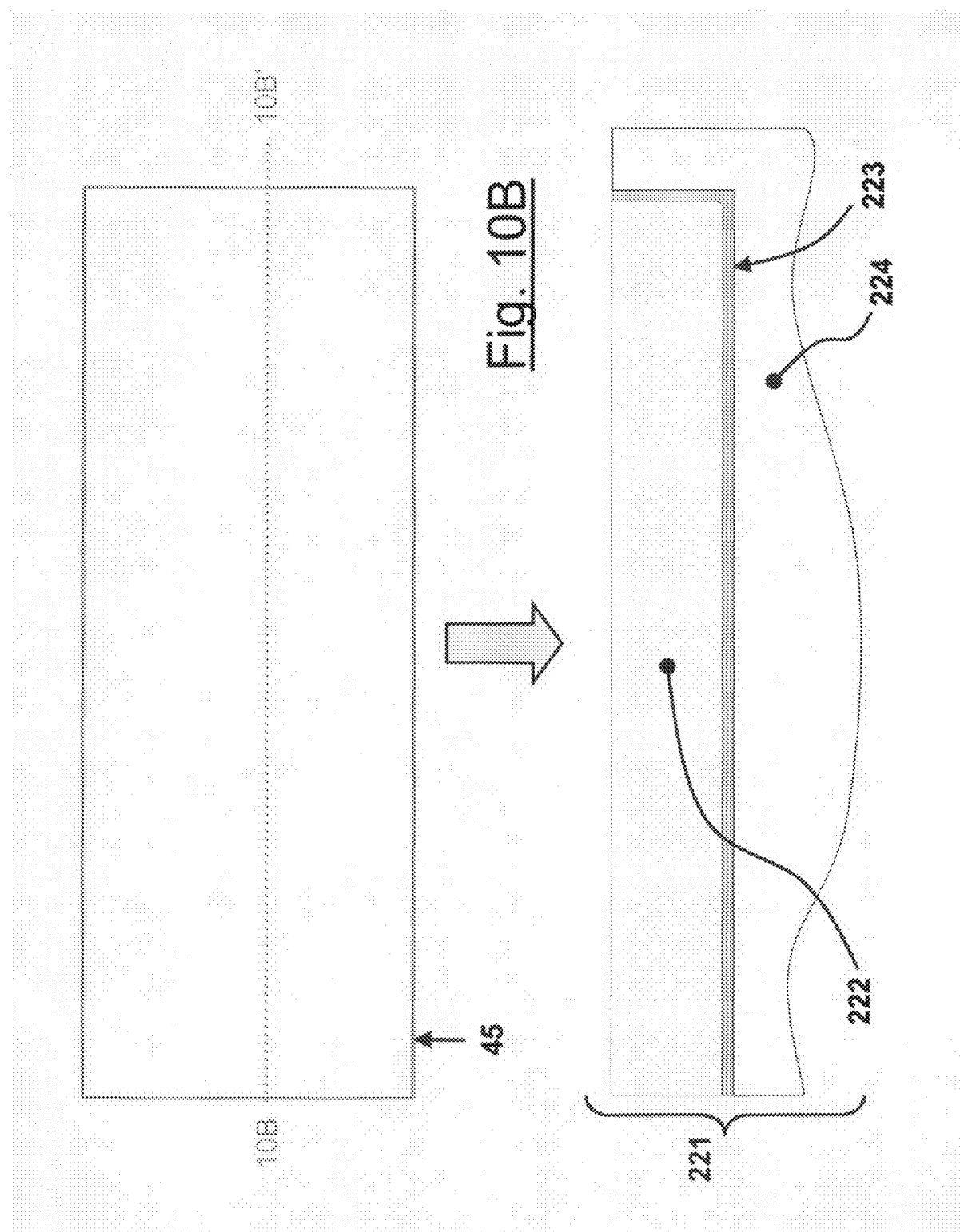

CASTELLATED GATE MOSFET DEVICE CAPABLE OF FULLY-DEPLETED OPERATION

CROSS REFERENCE TO RELATED APPLICATIONS

This application is a continuation-in-part of U.S. patent application Ser. No. 10/940,093, filed Sep. 13, 2004, now U.S. Pat. No. 7,211,864, to John J. Seliskar entitled, "An Improved Fully-Depleted Castellated Gate MOSFET Device and Method of Manufacture Thereof", the contents of which are hereby expressly incorporated herein by reference. In addition, this application relates to co-pending U.S. patent application Ser. No. 11/728,111, filed Mar. 23, 2007, to John J. Seliskar entitled, "An Improved Fully-Depleted Castellated Gate MOSFET Device and Method of Manufacture Thereof", and which is a division of the above-referenced U.S. patent application Ser. No. 10/940,093, filed Sep. 13, 2004.

BACKGROUND OF THE INVENTION

1. Field of the Invention

The present invention relates generally to field effect transistors (FET's) formed as complimentary metal oxide semiconductor (CMOS) structures and, more particularly, to new and improved MOSFET devices having vertically oriented channel structures capable of fully depleted operation at short channel lengths, thereby providing a device for robust I/O applications. Specifically, the present invention relates to an improved MOSFET device that provides high performance analog and mixed-signal solutions useful in a wide variety of applications.

2. Description of the Prior Art

The progression of CMOS device scaling, that is planer MOSFET, has seen a continuous shrinking of transistor dimensions in both the vertical and the horizontal dimensions resulting in an approximate doubling of the number of transistors per unit area every 18 months or so. From the economics perspective, this scaling progression has resulted in CMOS becoming the preeminent technology for packing system functions on a transistor chip. The desire to shrink gate channel lengths and hence area, as width-to-length ratios remain roughly constant, requires the simultaneous vertical scaling of both the gate oxide and the source/drain junctions. This creates the requirement that the power supply (Vdd) also scale, as indicated above. The power supply voltage must scale so as to maintain gate oxide integrity (breakdown/wearout due to voltage stress), to provide adequate junction breakdown margin, and to minimize device lifetime reduction due to hot carrier injection.

While CMOS scaling has enabled the circuit and system designer to pack a tremendous amount of functionality onto a silicon die, it has simultaneously created a number of significant problems as far as the chip's ability to interface with the outside world. This is particularly true in the area of analog/digital mixed-signal chips, and in particular for communication and power management applications which may be used or exist in a less-controlled signaling environment than found in all-digital systems. Some examples of the efforts to overcome this are illustrated in U.S. Pat. No. 4,393,391, No. 4,583,107, No. 5,675,164, No. 5,801,417, No. 5,932,911, No. 6,111,296, No. 6,118,161, No. 6,207,511, No. 6,396,108 and No. 6,413,802.

As a result of the above, the continuing drive to utilize semiconductor chip area while maintaining I/O compatibility has resulted in the evolution of baseline CMOS ASIC/SOC process technologies that now have two gate oxides to account for the need to operate efficiently at two, and sometimes three, power supply levels. Having begun at roughly the 0.25 um node, this is currently the approach taken by certain mainstream ASIC/ASSP semiconductor producers or foundries. These technology offerings generally consist of a baseline process flow that has a fully scaled and optimized thin oxide core device to the extent that the current process manufacturing technology allows, and a thick oxide device which is essentially the core device from the previous technology generation. Unfortunately, in such technology evolution, the thick oxide I/O device has become somewhat of a "forgotten stepchild", as only the thin-oxide core devices can truly take advantage of the shrinking feature sizes that are enabled by state-of-the-art photolithography. More importantly, as the thick oxide device is a "leftover" from the previous technology node, it typically under-performs the thin-oxide core device in terms of speed/bandwidth ($f_t$).

The impact of this trend is particularly acute in the area of all-CMOS analog and mixed analog/digital signal chips. These chips derive their advantage from the ability to integrate complex digital core functions, such as DSP, with analog signal processing functions, such as analog-to-digital or digital-to-analog converters. While this reliability-driven voltage trend results in lower power consumption for digital functions, the effect is not necessarily the same in the analog case. In fact, it has been shown that in an analog-to-digital converter application with a fixed dynamic range requirement, power consumption can actually increase with decreasing power supply.

More problematic from the standpoint of device reliability and survivability is the significantly harsher EMI (electromagnetic induction)/ESD (electrostatic discharge) environment seen by I/O devices used in mixed-signal communications applications. To further illustrate this problem, some typical mixed-signal I/O and communications interfaces include system backplane, chip-to-chip and cell phone (RF). In many such electronic systems, the power supply voltage is specified within a 3-sigma tolerance of ±10%. However, in a data transmission or communication situation, there is the additional problem of signal reflections due to improperly terminated transmission lines.

In the first two mixed-signal examples, that is system backplane and chip-to-chip, a termination problem could chronically arise due to manufacturing tolerances, or as the result of devices connecting and disconnecting from the bus, or perhaps as a "hot swap" situation. Another common example of a harsh ESD/EOS environment is that of the cellular phone. The power amp of the transmitter must be able to tolerate the high VSWR conditions that can occur under large output load mismatch conditions. This can happen if the cell-phone antenna is touched or pulled-off during the transmission of a call.

Another important factor for consideration when discussing I/O robustness in bulk CMOS technologies is that of latch-up, where a low impedance path is created between the power supply rail and the ground rail as a result of the interaction of parasitic p-n-p and n-p-n bipolar transistors. One of the known causes of latch-up is an ESD event that results in the injection of minority carriers from the clamping device in the protection circuit into either the substrate bulk or the well. In a harsh I/O environment, transmission line reflections may also trigger the ESD protect device, thus increasing the probability that a latch-up condition can occur.

At present, BiCMOS (bipolar-CMOS combination) technologies, and particularly SiGe bipolar, offer a solution to some of the problems discussed above. However, a number of difficulties persist including, in particular, power consumption, cost and scalability. Bipolar devices consume significantly more power than CMOS devices, which increases package cost and at some point renders them unsuitable as a system solution, in particular for portable devices. From the standpoint of scaling, bipolar technologies have hit an apparent limit in terms of increasing performance for a given density and power consumption. The integration of CMOS and bipolar devices (BiCMOS) reduces the power consumption problem but leads to a second difficulty, i.e. cost. High performance technologies, such as SiGe BiCMOS cost upwards of 25% or more than CMOS devices at the same feature sizes. Finally, bipolar devices by nature, like the thick oxide CMOS I/O devices discussed earlier, cannot take full advantage of decreasing feature sizes which result from advances in wafer patterning technology (photolithography).

Clearly, the trends and problems discussed above may soon create a situation where it is no longer desirable to integrate a significant amount of analog functionality into a single-chip mixed-signal system solution, thus eliminating one of the traditional paths to reduce cost and power consumption in electronic systems. Accordingly, there is a need for a new type of silicon technology platform that takes advantage of the low power and economic advantages of CMOS in addition to enhancing the I/O function through decreasing feature sizes. There have been numerous attempts to develop such devices which overcome the aforementioned problems. Some specific examples of these efforts are illustrated in U.S. Pat. No. 6,111,296, No. 6,127,702, No. 6,198,141, No. 6,355,532 and E.P Patent No. 1,091,413. However, these problems still persist. Therefore, there remains a need in the art for such a device, and the present invention addresses and solves these particular problems in the art.

SUMMARY OF THE INVENTION

Accordingly, it is one object of the present invention to provide an improved, castellated-gate MOSFET device capable of fully depleted operation.

It is another object of the present invention to provide such a device having drive current per unit area increases up to an order-of-magnitude or greater (>10×) than existing VLSI I/O devices.

Yet another object of the present invention is to provide a device with a Unity Gain Frequency three to five times (3×-5×) greater than existing VLSI I/O devices for a given wafer area.

Still another object of the present invention is to provide a high speed I/O device having enhanced ESD/EOS and reliability characteristics relative to existing VLSI I/O devices for a given wafer area.

A further object of the present invention is to provide a high speed I/O device that enables circuitry with improved/reduced latch-up susceptibility on non-SOI wafers.

Yet another object of the present invention is to provide a castellated gate MOSFET device capable of symmetrical operation with respect to the source and drain terminals.

Another object of the present invention is to provide an area-dense VLSI I/O device with improved thermal conduction properties from the silicon active area (heat dissipation).

Still another object of the present invention is to provide a castellated-gate MOSFET device with reduced junction capacitance as compared to its planer counterpart for the same drive current.

A further object of the present invention is to provide a MOSFET I/O device for VLSI applications with reduced equivalent gate resistance as compared to its planer counterpart for the same drive current.

A further object of the present invention is to provide a MOSFET I/O device for VLSI applications with reduced body effect coefficient, when fabricated on a bulk starting wafer, as compared to its planer counterpart for the same drive current.

A still further object of the present invention is to provide a MOSFET I/O device which has a physical design layout and operational physical structure which is independent of the starting wafer type, that is bulk, SOI, epi, strained-surface, or otherwise engineered.

Yet another object of the present invention is to provide a castellated gate MOSFET I/O device capable of fully depleted operation while having dual polarity source and drain regions.

To achieve the foregoing and other objects and in accordance with the purposes of the present invention, as embodied and broadly described herein, a castellated-gate MOSFET I/O device capable of fully depleted operation is disclosed. The device includes a semiconductor substrate region having an upper portion with a top surface and a lower portion with a bottom surface. A source region and a drain region are formed in the semiconductor substrate region, and a channel-forming region is also disposed therein between the source and drain regions. Trench isolation insulator islands, having upper and lower surfaces, surround the source and drain regions as well as the channel-forming region. The channel-forming region includes a plurality of thin, spaced, vertically-orientated conductive channel elements that span longitudinally along the device between the source and drain regions. A gate structure is provided in the form of a plurality of spaced, castellated gate elements interposed between the channel elements, and a top gate member interconnects the gate elements at their upper vertical ends to cover the channel elements. The conductive channel elements are super-self-aligned from the gate structure to the source and drain regions. Finally, a dielectric layer separates the conductive channel elements from the gate structure.

In one modification of the invention, the source and drain regions of the device are preferably of dual-polarity, each being a composite of n-type and p-type dopant impurities.

In another modification, the device further includes at least one electrically insulating material layer formed in the semiconductor region lower portion beneath the source and drain regions. In one form of this modification, the electrically insulating material layer is spaced below the bottom surface of the trench isolation islands to form a common semiconductor connection in the lower portion of the device. In addition, the electrically insulating material layer may selectively abut the bottom surface of the shallow trench isolation islands and the channel-forming region.

In an alternate form of the invention, the source and drain regions are each dually doped to create their dual polarity. In this form, the dopant of the channel-forming region is of a first conductivity type, the dopant of the upper portions of the source and drain regions is of a second conductivity type at a degenerate concentration, and the dopant of the lower portions of the source and drain regions is of the first conductivity type but of an order of magnitude greater than the dopant level of the channel-forming region.

Another modification of the invention includes a castellated-gate MOSFET I/O device which is capable of fully depleted operation and is substantially independent of starting wafer type. The device includes a semiconductor substrate region of a first conductivity type, having an upper portion with a top surface and a lower portion with a bottom surface. A dual-polarity source region is provided and has an upper highly doped portion of a second conductivity type and a lower doped portion of said first conductivity type but of a higher concentration level than that of said substrate region. Likewise, a dual-polarity drain region is also provided having an upper highly doped portion of a second conductivity type and a lower doped portion of said first conductivity type but of a higher concentration level than that of said substrate region. A channel-forming region is deposed between the source and drain regions, the channel-forming region including a plurality of thin, spaced, vertically-orientated conductive channel elements that span longitudinally along the device between the source and drain regions. Trench isolation insulator islands surround the dual-polarity source and drain regions as well as the channel-forming region and having upper and lower surfaces. A gate structure is provided in the form of a plurality of spaced, castellated conductive gate elements interposed longitudinally between and outside of the channel elements, and a top gate member interconnecting the gate elements at their upper vertical ends to cover the channel elements. The gate elements have a depth less than the lower surface of the shallow trench isolation islands. Finally, a dielectric layer separates the conductive channel elements from the gate structure.

In still another modification of the invention, a castellated-gate MOSFET device capable of fully depleted operation and substantially independent of starting wafer type is provided. The device includes a semiconductor substrate region having an upper portion with a top surface and a lower portion with a bottom surface. A dual-polarity source region, a dual-polarity drain region, and a channel-forming region are disposed between the source and drain regions, all of which are formed in the semiconductor substrate region. Trench isolation insulator islands are provided with upper and lower surfaces and surround the source and drain regions as well as the channel-forming region. The channel-forming region is provided and includes a plurality of thin, spaced, vertically-orientated conductive channel elements that span longitudinally along the device between the source and drain regions. A gate structure in the form of a plurality of spaced, castellated gate elements is interposed between the channel elements, and a top gate member interconnects the gate elements at their upper vertical ends to cover the channel elements. A dielectric separating layer is interposed between the conductive channel elements and the gate structure. Finally, gate spacer structures are positioned between the castellated gate elements and the source and drain regions, with the gate spacer structures being contiguous with and substantially the same thickness as the dielectric separating layer.

BRIEF DESCRIPTION OF THE DRAWINGS

The accompanying drawings which are incorporated in and form a part of the specification illustrate preferred embodiments of the present invention and, together with a description, serve to explain the principles of the invention. In the drawings:

FIG. 3C illustrates an enlarged perspective view of one sub-section of the castellated gate device of the embodiment illustrated in FIGS. 3 and 3A;

FIG. 3D illustrates another enlarged perspective view, with parts in shadow, of the sub-section of the castellated gate device of FIG. 3C;

FIG. 4 is a top view including the photolithography masking elements of a second embodiment of the present invention, illustrating two similar orientations and one orientation 90° relative to the first two orientations to illustrate the complete structure of the embodiment;

FIG. 4A is a cross-sectional view taken substantially along line 4A-4A' of FIG. 4;

FIG. 5A is a cross-sectional view taken substantially along line 5A-5A' of FIG. 5;

FIG. 6 is a top view including the photolithography masking elements of a fourth embodiment of the present invention, illustrating two similar orientations and one orientation 90° relative to the first two orientations to illustrate the complete structure of the embodiment;

FIG. 6A is a cross-sectional view of the fourth embodiment taken substantially along line 6A-6A' of FIG. 6;

FIG. 7 is a top view including the photolithography masking elements of a sixth embodiment of the present invention, illustrating two similar orientations and one orientation 90° relative to the first two orientations to illustrate the complete structure of the embodiment;

FIG. 8 is a top view including the photolithography masking elements of a seventh embodiment of the present invention, illustrating two similar orientations and one orientation 90° relative to the first two orientations to illustrate the complete structure of the embodiment;

FIG. 10A is a cross-sectional view of the ninth embodiment taken substantially along line 10A-10A' of FIG. 10;

FIG. 10B is a cross-sectional view of the starting substrate of FIG. 10 within which the ninth embodiment of the device is deposed, taken substantially along line 10B-10B' of the top down view of the region-defining mask, also shown at the top of FIG. 10B;

DETAILED DESCRIPTION OF THE EXEMPLARY EMBODIMENTS

One attractive approach to the aforementioned problems, and particularly high speed VLSI I/O, is to incorporate fully-depleted castellated-gate MOSFET's as an add-on to standard CMOS core-technologies. A fully-depleted castellated-gate MOSFET is essentially a vertical dual-gate, or tri-gate "FinFET" device, with the important distinction that it normally incorporates multiple "fins" to perform its function, unlike the "FinFET" core technology device which must be optimized to perform its function as a single vertical device or "fin". Additionally, the fully-depleted castellated gate MOSFET of the present invention is intended for use as an I/O device, typically with a much thicker gate oxide than the device technology that would make up a digital core, such as a CPU or DSP, as well as with a higher target operating voltage. Finally, a significant proportion of FinFET devices are intended for fabrication on silicon-on-insulator (SOI) starting substrates, while the fully-depleted castellated-gate (FDCG) MOSFET of the present invention is preferably formed on a lower cost bulk silicon substrate as described in greater detail below. This latter feature of the present FDCG MOSFET can offer significant advantages in reducing the susceptibility of the device to known snapback phenomenon of SOI devices, as well as provide a connection of low thermal resistivity between the channel carrying elements and the wafer bulk thereby aiding heat dissipation in the device.

Figure 1:
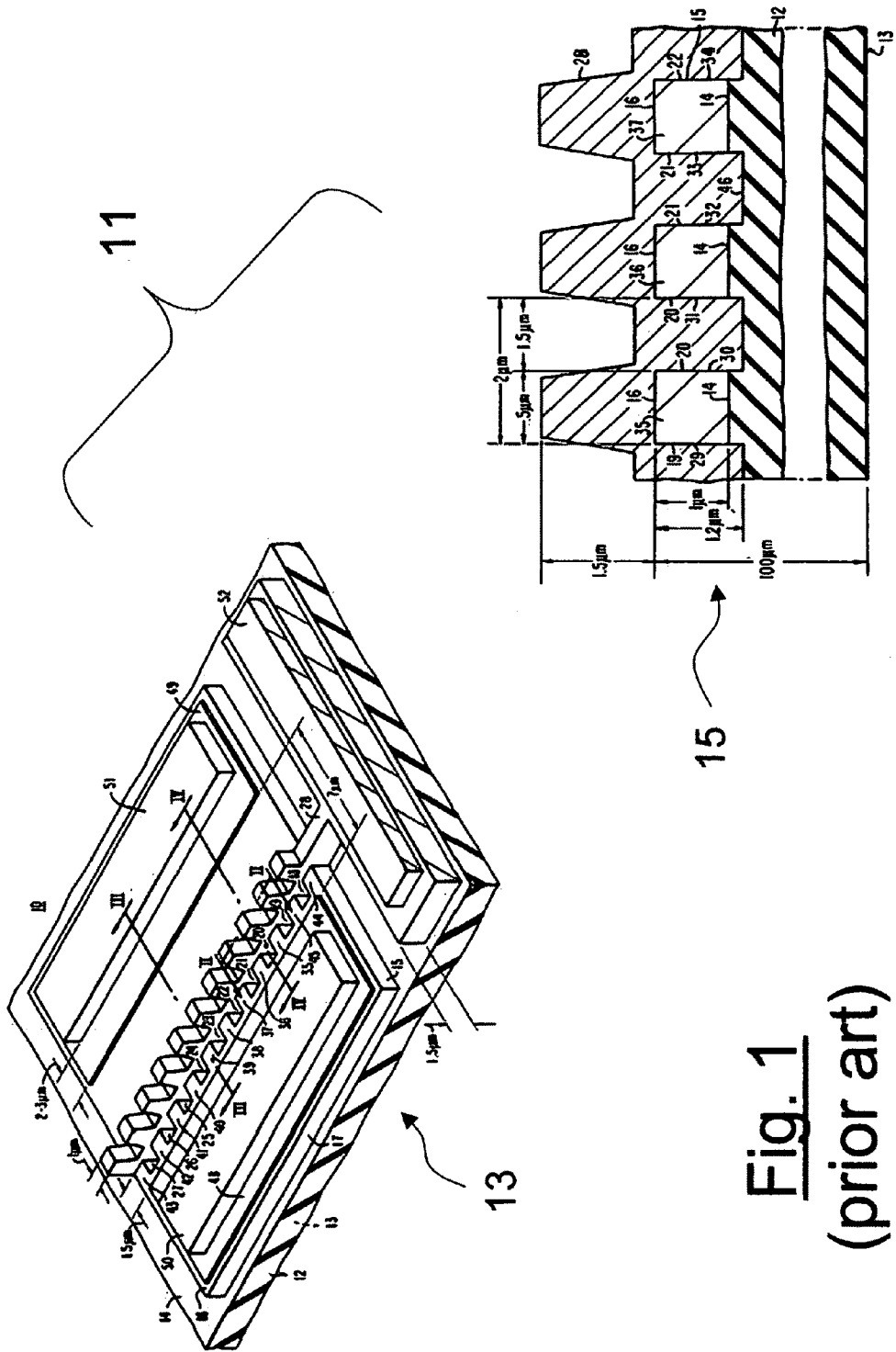
FIG. 1 illustrates perspective and cross-sectional views of a prior art device incorporating discrete GaAs castellated-gate MESFET structures.

Generally speaking, the lineage of vertical dual-gate CMOS devices, such as the presently-popular FinFET, can be traced to the development work that has been done in the area of SOI devices, as well as the application of castellated gate structures to improve the performance of GaAs FET devices. Referring now to FIG. 1, a prior art discrete GaAs Castellated Gate MESFET device 11, in accordance with U.S. Pat. No. 4,583,107, is illustrated in perspective view 13 and cross-sectional view 15. Generally speaking, the object of creating a vertical channel structure in a transistor is to increase the effective gate width of the device without a like increase in surface/die area. An important result of the vertical tri-gated/castellated-gate GaAs MESFET work such as illustrated in FIG. 1 was the detection of improvement in the device Short-Channel Effects (SCE) beyond what the geometrical theory predicted at the time. The subsequent development of Molecular Beam Epitaxy (MBE) manufacturing technology for GaAs devices resulted in the vertical device architecture being less favorable.

In the case of power devices, such as those illustrated in U.S. Pat. No. 4,393,191 or U.S. Pat. No. 5,801,417, castellated gate structures have been used to increase the effective width of typically discrete FET devices. While the use of a castellated/periodic gate structure increases the drive current per unit area of these devices, it also proportionally increases their gate capacitance such that no net improvement in Gain Bandwidth Product is produced. Secondly, because the half-periodicity of the gate structure in such devices is greater than the depletion width, no improvement in short channel effects is generally expected.

Figure 2:
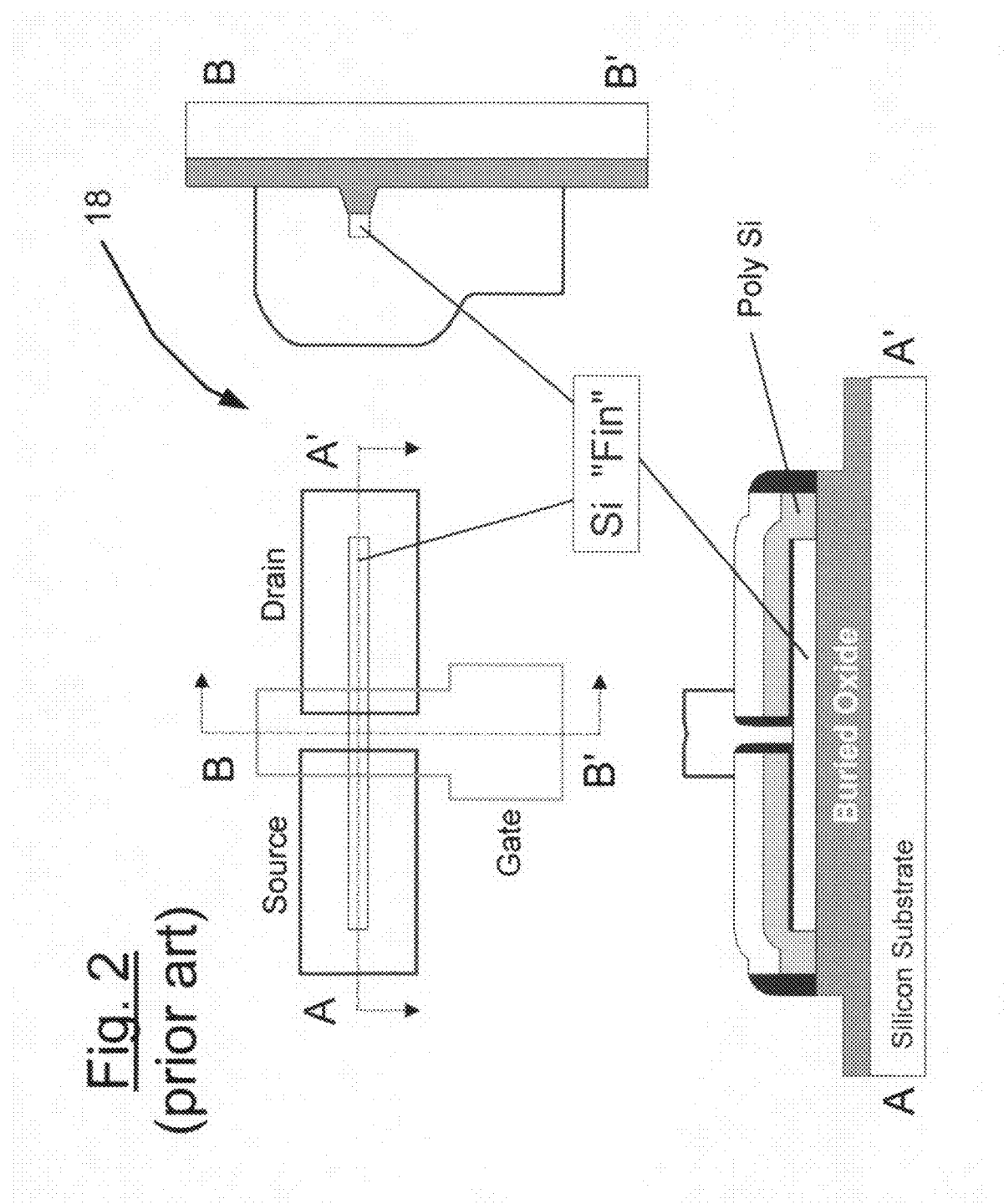
FIG. 2 includes planar and cross-sectional views of a prior art dual-gate FinFET device on a silicon-on-insulator substrate.

Subsequently, as the highly desirable electrical characteristics of fully-depleted MOS devices became known, the possibility of having two gates to control the channel region was investigated. Referring now to FIG. 2, in the area of silicon dual-gate devices, a typical prior art FinFET device 18 is demonstrated. The FinFET device 18 is a self-aligned quasi-planer SOI device having the advantage that it can be fabricated using existing CMOS manufacturing techniques and mask layout practices. A more flexible fin-type device architecture similar to that of device 18 was also proposed that included the option of using a bulk epitaxial starting substrate. However, this arrangement does not account for the possibility of forming a P-type, device on a non-SOI substrate. In spite of the innovations previously described in the area of castellated gate FET's and FinFET silicon devices, the present Fully-Depleted Castellated Gate (FDCG) MOSFET arrangement provides an opportunity for a device that can serve as a high performance I/O device add-on in standard foundry-compatible CMOS system-on-a-chip technology. It is within the previously described system-application framework that the device structure of the present invention is disclosed.

Figure 3:
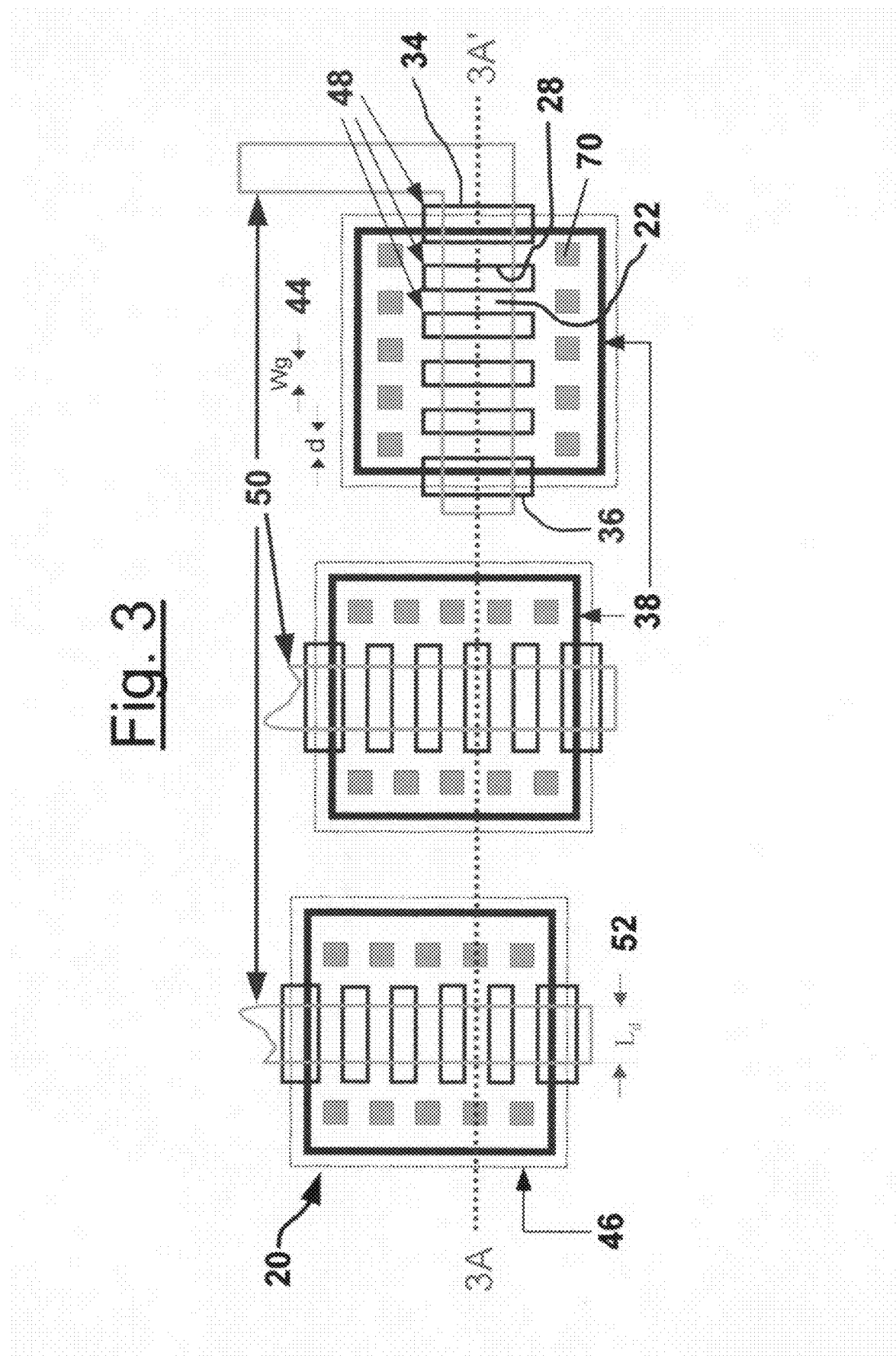
FIG. 3 is a top view of the photolithography masking elements of a first embodiment of the present invention, illustrating two similar orientations and one orientation 90° relative to the first two orientations to illustrate the complete structure of the embodiment.
Figure 3A:
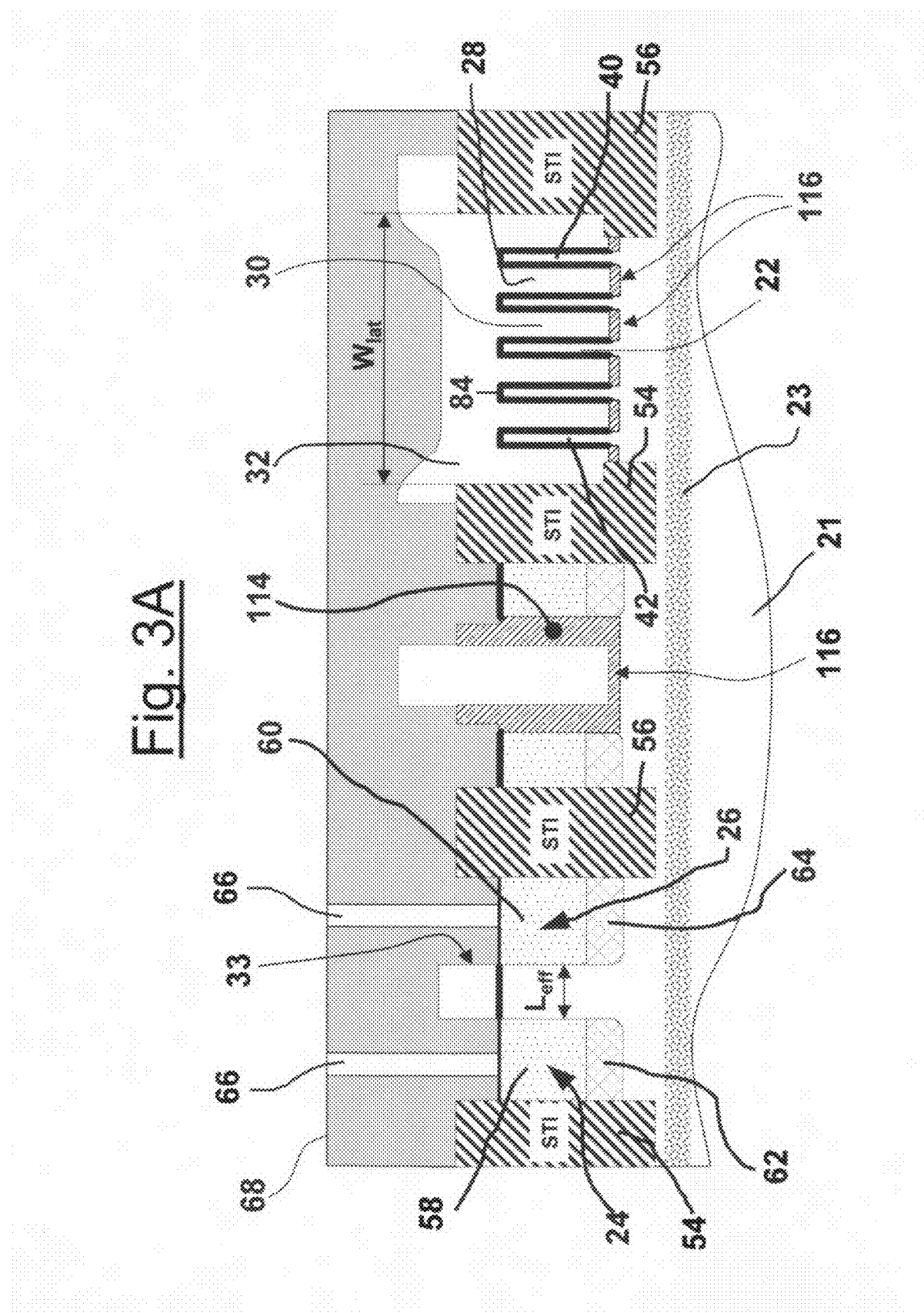
FIG. 3A is a cross-sectional view taken substantially along line 3A-3A' of FIG. 3.

Referring now to FIGS. 3 and 3A, a tri-gated NMOS version of the present invention is illustrated with its photo masking layers in one possible embodiment using a low-doped bulk silicon substrate. FIG. 3 illustrates one device in two similar orientations and then in an orientation 90° relative to the first two orientations to illustrate the complete structure from a top view as well as in cross-section as illustrated by FIG. 3A. The device 20 includes a silicon substrate wafer 21 and a plurality of thin silicon channels 22 that span the distance between a source 24 and a drain 26. In summary, these channels 22 are formed by etching gate slots 28 into the active silicon, filling the slots with a dielectric material, preferably oxide, clearing out an area of the dielectric material within the gate slots to thus form a spacer, depositing a gate dielectric, and then filling the slot regions with a conductive gate material to form a plurality of vertical, spaced gate elements 30 which are connected together by a top gate 32. The thin silicon channels 22 are preferably contiguous with the silicon material of the original starting wafer 21 from which they were fabricated, as can be seen in FIG. 3A. As such, they are continuously connected to the starting wafer both electrically and thermally.

As shown, two outer-most gate-slot mask shapes 34, 36 span both sides of the active region, as defined by the active layer mask 38, in order to eliminate leakage, maintain fully-depleted operation in the two outer-most silicon channels 40, 42, and provide design rule margin in the event of mask misalignment. The outer-most gate-slot masks 34, 36 are shown to be a width greater than the internal array width Wg as represented by line 44. It should be noted, however, that the two outer-most silicon channels 40, 42 could also be the same as width Wg, depending on the degree of process control available. Source and drain (S/D) implant masks 46 for the device 20 overlap the active layer mask 38 by a predetermined distance as is a known practice in planer CMOS physical design. The gate-slot masks 48 overlap the gate mask 50 in the direction of channel length Ld, indicated by line 52, with the amount of the overlap representing the spacer thickness which reduces Cgs. The gate mask 50 overlaps the gate slot mask 48 by a predetermined distance in the direction of the width of the device 20, i.e. orthogonal to the channel length Ld 52 for reasons consistent with gate-to-active overlap rules in standard planer CMOS process flows.

FIG. 3A illustrates the cross-section of the device 20 in the two different illustrated orientations. Structurally, the gate slots 28 of the device 20 are etched to a first predetermined depth that is typically less than the depth of the Shallow Trench Isolation (STI) or LOCOS Field Oxide Islands 54, 56. The gate slot trenches 28 are filled with a dielectric, preferably oxide, planarized, and then re-etched to a second predetermined depth which is less than the first, simultaneously forming a thick bottom gate oxide and spacers between a gate conductor, which will fill the gate slots 28, and the source/drain regions 24, 26. The first and second predetermined depths may both fall within a range of 250 to 1200 nanometers, with the first depth always greater than the second when a bulk wafer is used as the substrate 21.

The outermost gate slot masks 34, 36 result in the formation of outermost gate conductor elements which simultaneously penetrate into both the silicon and bounding Shallow-Trench Isolation (STI) 54, 56 of the device 20. In the case of a dual-gate embodiment of the present invention (see FIGS. 4-4A), a nitride cap 57 may reside on top of the conducting elements 22, thereby shutting off the top gates. A key feature of the present invention is that the source/drain structure 24, 26 of the device 20 is preferably a composite of both N-Type and P-Type impurities, that is, they are of dual-polarity. The depth and thickness of the source and drain implant layers 24, 26 and their relation to the depth of the gate slots 28 are also key parameters for the proper operation of the device. In the NMOS example of FIGS. 3 and 3A, the upper portions 58, 60, respectively, of the source and drain regions 24, 26 are degenerately doped n-type. This forms an actual p-n junction to the body of the device 20 and an electrical connection to the channel 22 of the device. The lower portions 62, 64, respectively, of the source and drain regions 24, 26 are heavily doped p-type, such that the peak of the doping profile is roughly coincident with the second predetermined depth to which the gate slots 28 have been etched. This arrangement forms a channel stop by raising the device threshold near the bottom of the gate electrode, and greatly reduces a source of electrons with which to form an inversion layer at the bottom of the gate slot.

Figure 3B:
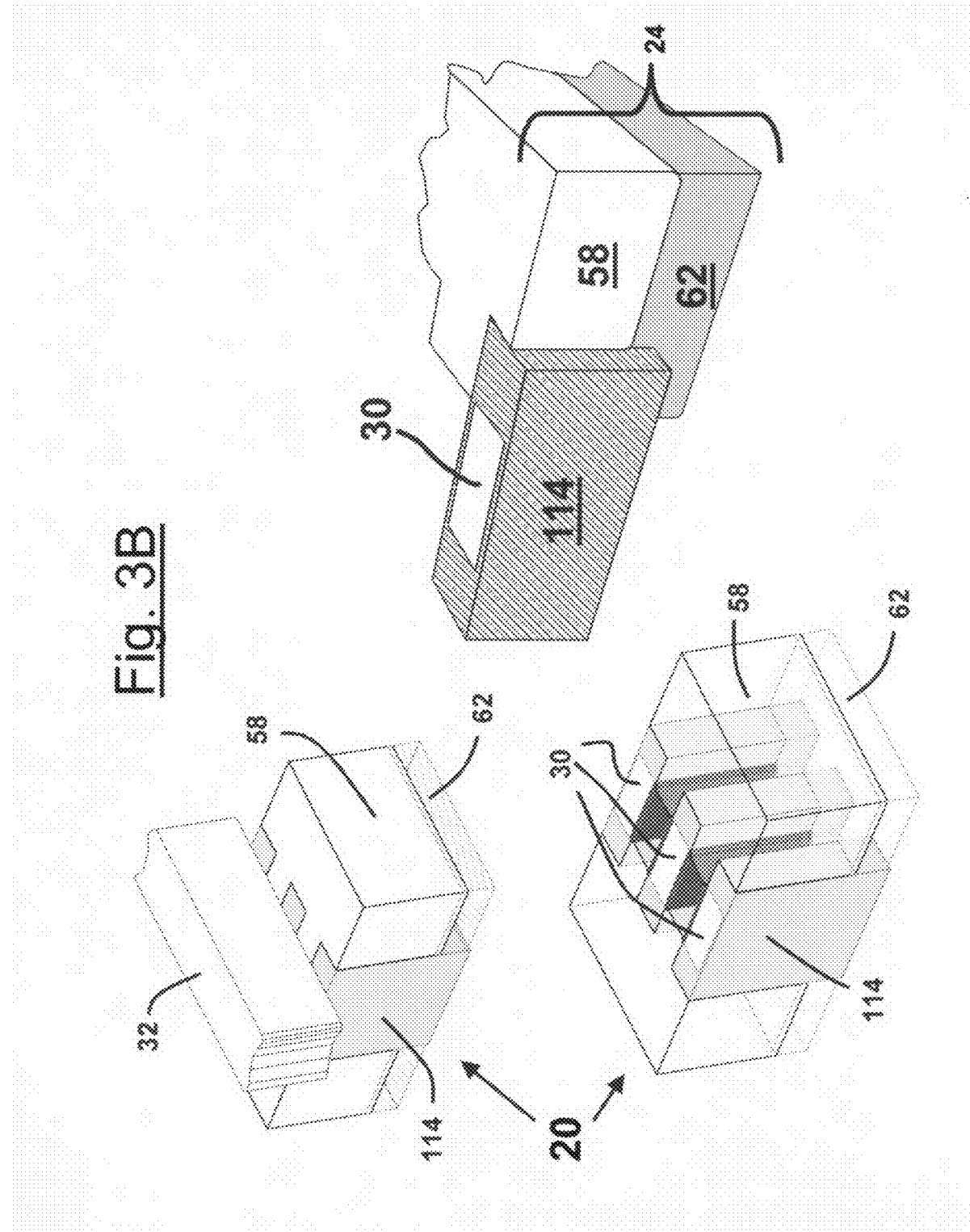
FIG. 3B illustrates an enlarged, partial cut-away perspective view of the dual-polarity source (or drain) structure of the embodiment of FIGS. 3 and 3A.

Now referring to FIGS. 3A-3C, a portion of the castellated-gate device 20 is shown in several perspective views in order to better illustrate the relationship of the dual-polarity source/drain to the other device structures. In the case of a device substrate area 21 with a first conductivity type, dual polarity source 24 and drain 26 structures are formed from upper channel connecting portions 58, 60, respectively, which are degenerately doped regions of a second conductivity type, and lower portions 62, 64, respectively, which are regions of the first conductivity type but at much higher doping concentration levels. The gate mask 50 is employed in such a way that dual-polarity source 24 and drain 26 structures are "self-aligned" laterally to the physical gate structure edge 33 during the implant process, consistent with manufacturing processes known in the art. Secondly, the structure resulting from the gate mask 50, combined with the dual-polarity source 24 and drain 26 structures, results in the device also being aligned vertically via the gate mask 50, therefore making the device Super-Self-Aligned.

Depending on the desired device electrical characteristics, the contacts 66 disposed within interlevel dielectric structure (ILS) 68 to the source and drain structures 24, 26 may be coincident with the upper silicon surface as illustrated in FIG. 3A, or the contacts 67 (as shown in FIG. 4A) may penetrate into the uppermost impurity layer. For example, surface contacts 66 could result in higher series resistance, which would be beneficial in enhancing ESD characteristics. In the particular example of FIGS. 3 and 3A, the contact masks 70 are laid-out in such a way as to be directly in-line with the conductive channels 22. This approach should provide the least device series resistance, thus improving device performance. Furthermore, it should be understood that additional process steps can be added to the overall fabrication sequence to shut-down the bottom gate. Examples are illustrated in the case of a dual-gate embodiment 72 illustrated in FIGS. 4 and 4A, including the addition of a highly doped "global" buried layer 74, preferably p-type for an NMOS device, and bottom gate implants 77, which raise the threshold voltage of the parasitic bottom gate structure 76 by adding an additional mask layer with associated processing.

Figure 5:
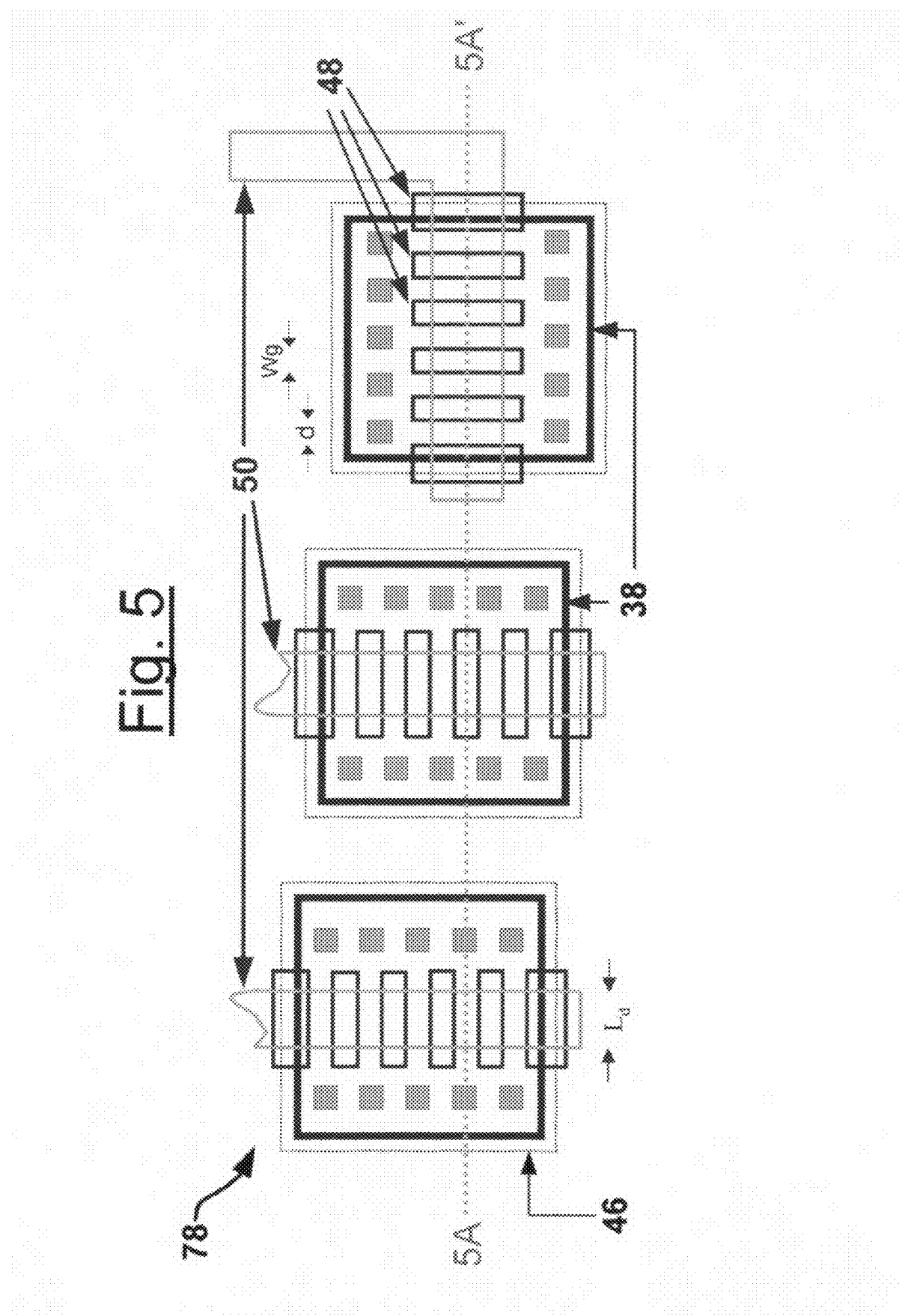
FIG. 5 is a top view including the photolithography masking elements of a third embodiment of the present invention, illustrating two similar orientations and one orientation 90° relative to the first two orientations to illustrate the complete structure of the embodiment.

FIGS. 5 and 5A illustrate an NMOS device embodiment 78 of the disclosed device invention using a silicon-on-insulator (SOI) starting substrate 80. Note that the device mask layout remains substantially the same as the case of the device 20 with the bulk starting wafer 21 shown in FIGS. 3-3A. Substantially similar to the bulk silicon substrate device 20, the device 78 includes a plurality of thin silicon channel elements 22 that span the distance between a source region 24 and a drain region 26. In the SOI wafer case of the device 78, the device's gate slots 82 can be etched to the same depth as the STI islands 54, 56, that is all the way to the buried oxide 75. However, there are advantages to leaving a common silicon connection 81 in the form of the substrate 21 of FIGS. 3 and 3A at the bottom, thus enabling the use of body contacts which can be employed to eliminate device snapback problems as well as provide a path of higher thermal conductivity with which to dissipate heat.

Once again, in the general case of the preferred bulk starting-wafer embodiment of FIGS. 3-3A, fabrication begins with a silicon wafer 21 of a first conductivity type, preferably p-type. The device 20 of this disclosed invention is deposed with the upper portions 58, 60 of the source and drain regions 24, 26 of a second conductivity type, preferably n-type in the case of an NMOS device. The lower portions 62, 64 of the source and drain structures 24,26 shown in FIGS. 3-3A are of the first conductivity type, but at a substantially higher, i.e. order-of-magnitude higher, concentration level than the concentration of the first conductivity type in the substrate 21.

The optional global buried implant layer 74 shown in FIGS. 4-4A is also preferably of the first conductivity type and also at a substantially higher concentration level than that of the substrate 80. A conducting gate material, preferably n-type insitu-doped polysilicon, is deposed within the gate slots 28 and patterned to simultaneously connect all formed gate elements 30 with a common conducting strap 32. While polysilicon is preferred gate material, mid-gap metal gates such as tungsten, titanium, tantalum or composites thereof, could also be used with appropriate changes to processing conditions. A dielectric material 84 separates the gate conductor 30, 32 from the conducting silicon channel elements 22. In preferred form, this gate insulator (or separator) 84 is preferably silicon dioxide ($SiO_2$), although other oxides or dielectrics may also be used including lanthanum oxide, hafnium oxide, oxynitride (ONO), or silicon nitride ($Si_3N_4$).

In the case of the SOI starting wafer shown in FIGS. 5-5A, the device 78 may additionally consist only of channel elements 22 of a first conductivity type, and single-layer (i.e., no p-n junction) source and drain structures 24, 26 of a second conductivity type. It should be understood that PMOS devices are formed using the same physical device structure as the above-described NMOS devices, but with the polarities of two conductivity types being reversed. Thus, the device of the disclosed invention prescribes a physical structure that can be used to form NMOS and PMOS devices on the same substrate (CMOS), with the appropriate addition of masking layer(s) to create the corresponding isolating well structures.

Figure 6B:
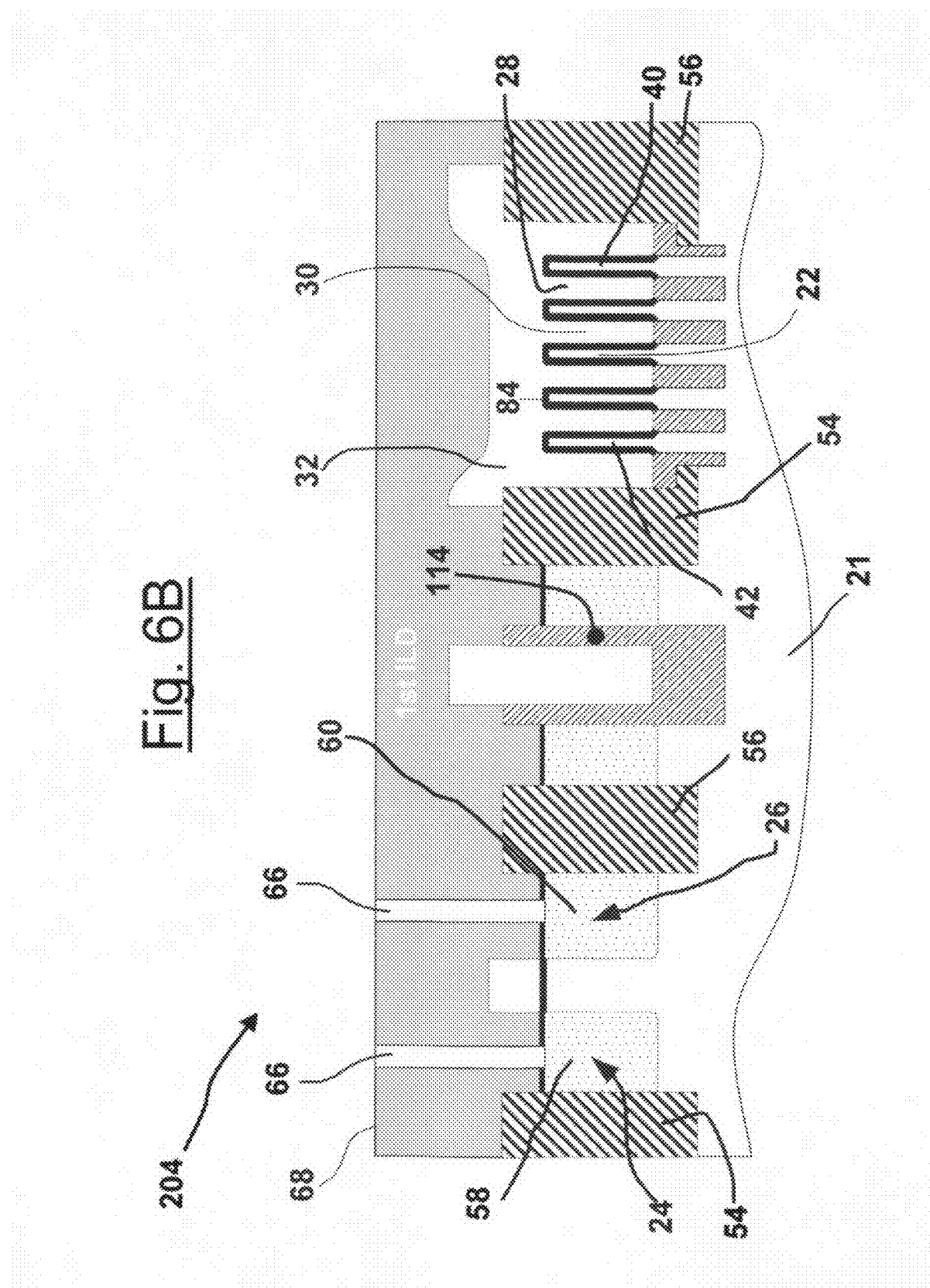
FIG. 6B is a cross-sectional view similar to that of FIG. 6A but illustrating a modified fifth embodiment of the present invention.

FIGS. 6 and 6A illustrate yet another NMOS device embodiment 202 of the disclosed device invention. In this embodiment, the gate slots 28 are preferably etched to a first predetermined distance which is greater than the depth of the Shallow Trench Isolation (STI) or LOCOS Field Oxide Islands 54, 56, unlike the prior embodiment of FIGS. 3 and 3A. As a result, the resulting bottom gate oxide 116 is now substantially large as compared to the active gate oxide 84 as illustrated in FIG. 6A. Moreover, an additional embodiment 204 may be realized as shown in FIG. 6B. In this modified embodiment, wherein the lower portions of the dual-polarity source 24 and drain 26 are omitted. Consequently, the device 204 of this embodiment has single-polarity source and drain structures 24, 26, respectively, and thus represents an embodiment of the present invention using bulk starting wafers in which a feature, i.e. the dual-polarity source and drain, may be omitted.

Figure 7A:
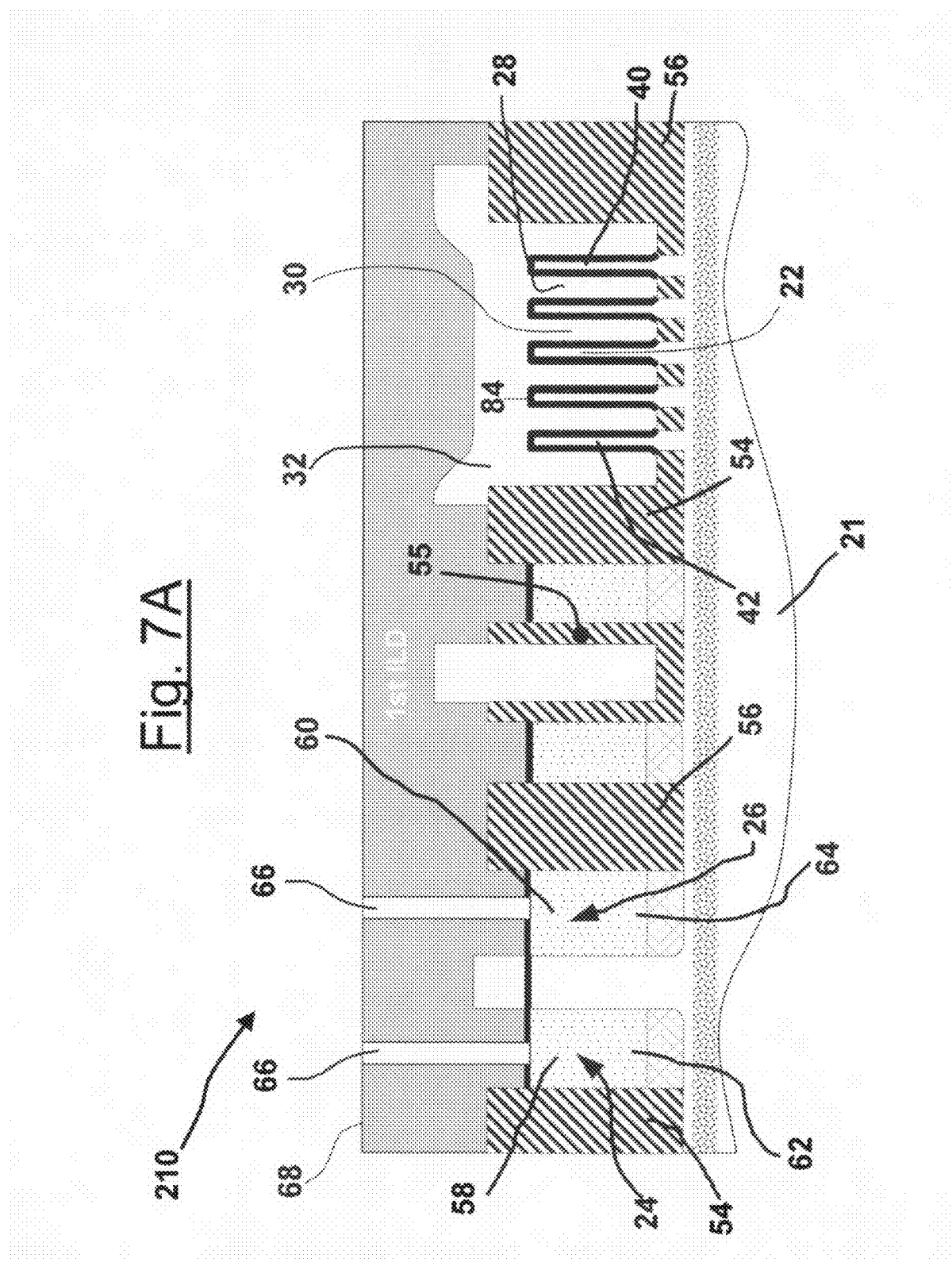
FIG. 7A is a cross-sectional view of the sixth embodiment taken substantially along line 7A-7A' of FIG. 7.

In another embodiment of the invention as illustrated in FIGS. 7 and 7A, a merged Shallow Trench Isolation Process step is used to form the device 210 wherein dual-polarity source/drain structures are used in combination with a spacer structure 55 that has been formed simultaneously with the Shallow Trench Isolation Structures 54, 56. In this embodiment, the first predetermined depth of the gate slots is identical to the depth of the Shallow Trench Isolator Islands 54, 56, and the device is Super-Self-Aligned by virtue of the gate mask 50, and the dual-polarity source and drain structures 24, 26, respectively.

Figure 8A:
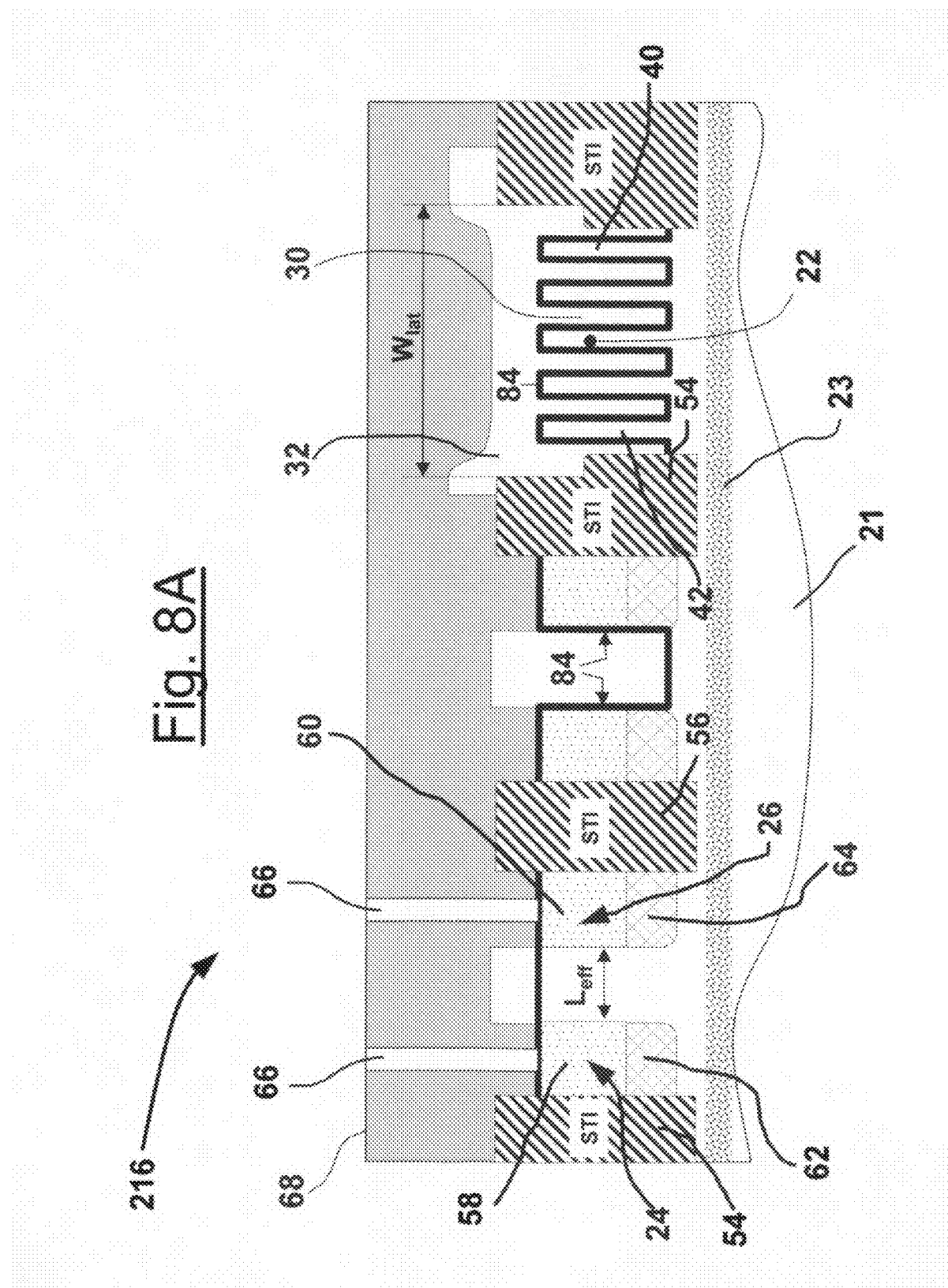
FIG. 8A is a cross-sectional view of the seventh embodiment taken substantially along line 8A-8A' of FIG. 8.

FIGS. 8 and 8A illustrate another embodiment 216 of the present invention wherein the spacer dielectric 114, with its associated thick bottom gate 116, (see FIGS. 3-3A and 6-6B) is omitted. Once again, the device mask layout remains substantially the same as the case of the device 20 with the bulk starting wafer 21 as shown in FIGS. 3-3A. However, now the edges of gate mask 51 are coincident with, or preferably slightly overlap, the gate slot mask 49 in the direction of channel length (Ld), as indicated by line 52. In this embodiment, the gate slot trenches 28 are etched to a first predetermined depth that is typically less than the depth of the Shallow Trench Isolation 54, 56.

As was the case of device 20 (see FIG. 3A), the outer gate slot masks 34, 36 result in the formation of outmost gate conductor elements which simultaneously penetrate into both the silicon and bounding Shallow Trench Isolation (STI) 54, 64 of the device 216. Dual-polarity source and drain regions 24, 26 are Super-Self-Aligned to the gate mask 50, thereby defining the conducting current channels within the plurality of thin silicon channels 22 that span the distance between them.

Figure 9:
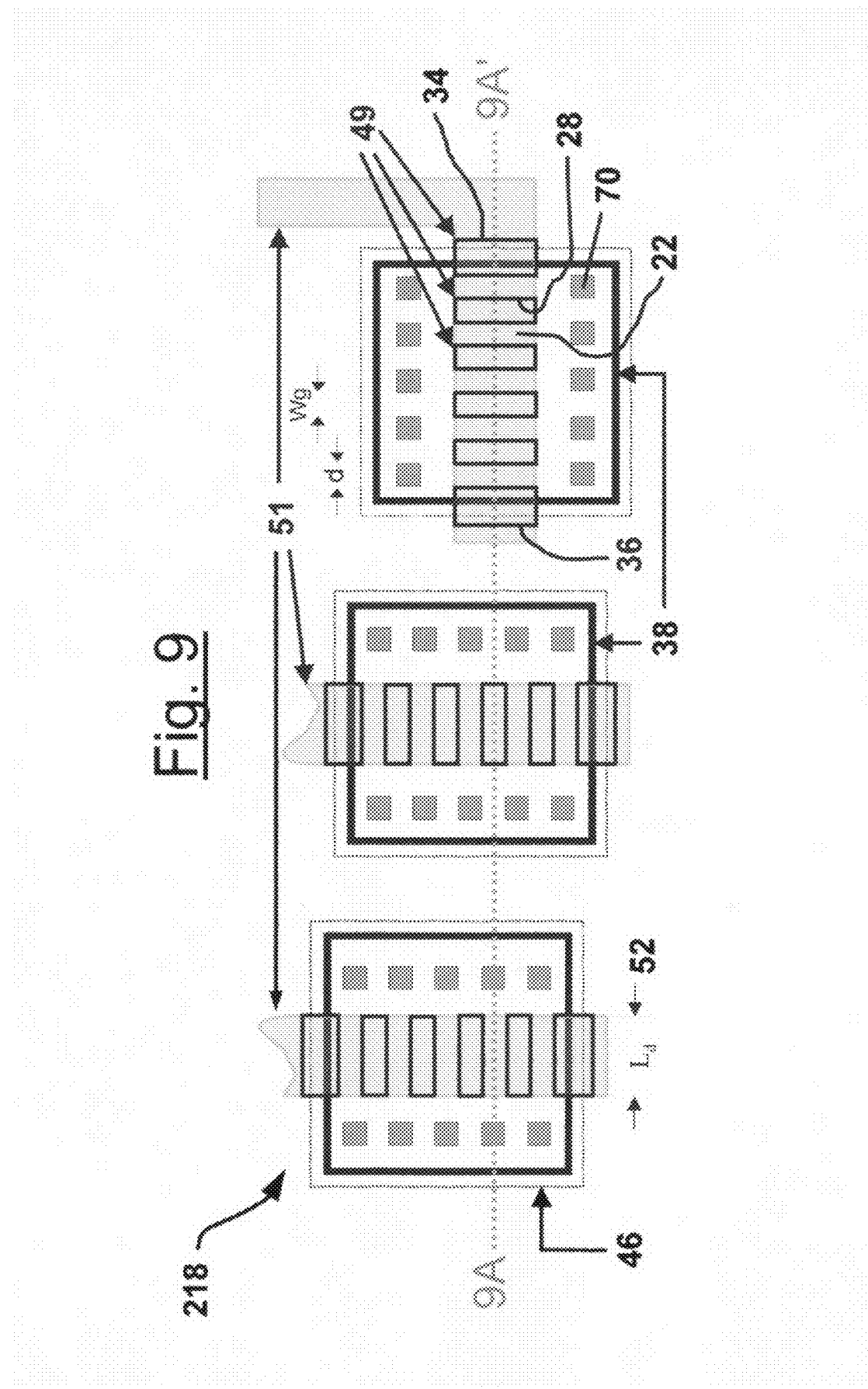
FIG. 9 is a top view including the photolithography masking elements of an eighth embodiment of the present invention, illustrating two similar orientations and one orientation 90° relative to the first two orientations to illustrate the complete structure of the embodiment.
Figure 9A:
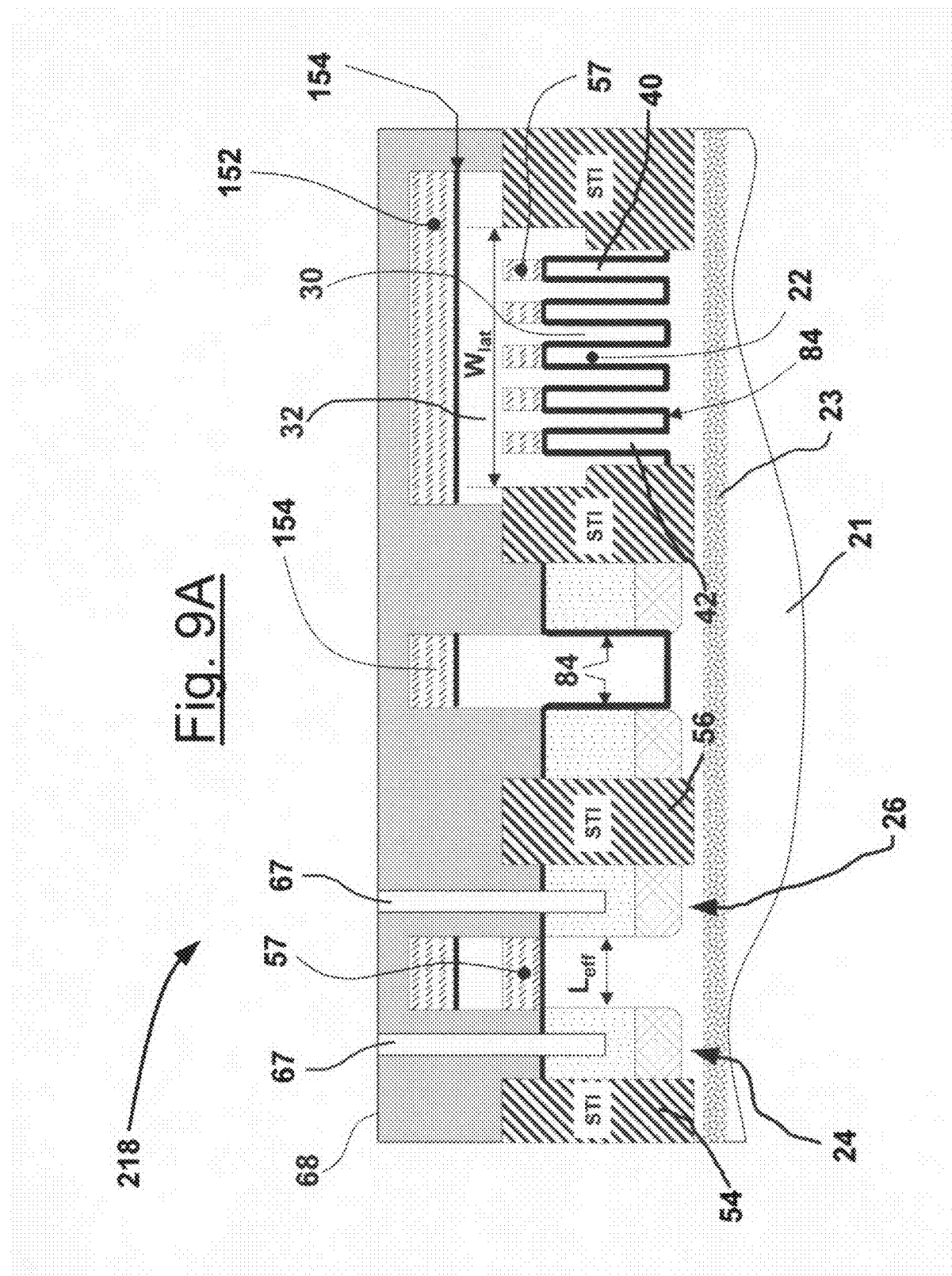
FIG. 9A is a cross-sectional view of the eighth embodiment taken substantially along line 9A-9A' of FIG. 9.

FIGS. 9 and 9A illustrate yet another embodiment 218 of the device of the present invention wherein certain elements, such as those illustrated in the device embodiment 72 of FIG. 4A, are incorporated in the structure, yet omitting the gate spacer dielectric 114 as in FIGS. 8 and 8A. More specifically, the dual-gated device 218 illustrates the incorporation of contacts 67, which penetrate into the uppermost impurity layer of dual-polarity source and drain structures, 24, 26, respectively. Dielectric caps 57, preferably of silicon nitride, reside on top of conducting elements 22, thereby inhibiting inversion at their upper surfaces. The device 218 incorporates a fully-planarized gate stack in which capping layers of silicon nitride 152 and oxide 154 have been left in place upon completion of device fabrication. Alternately, the capping layers 152, 154, can be removed prior to the completion of fabrication, as in the case of the fully-planarized gate structure of device 72 illustrated in FIG. 4A.

Figure 10:
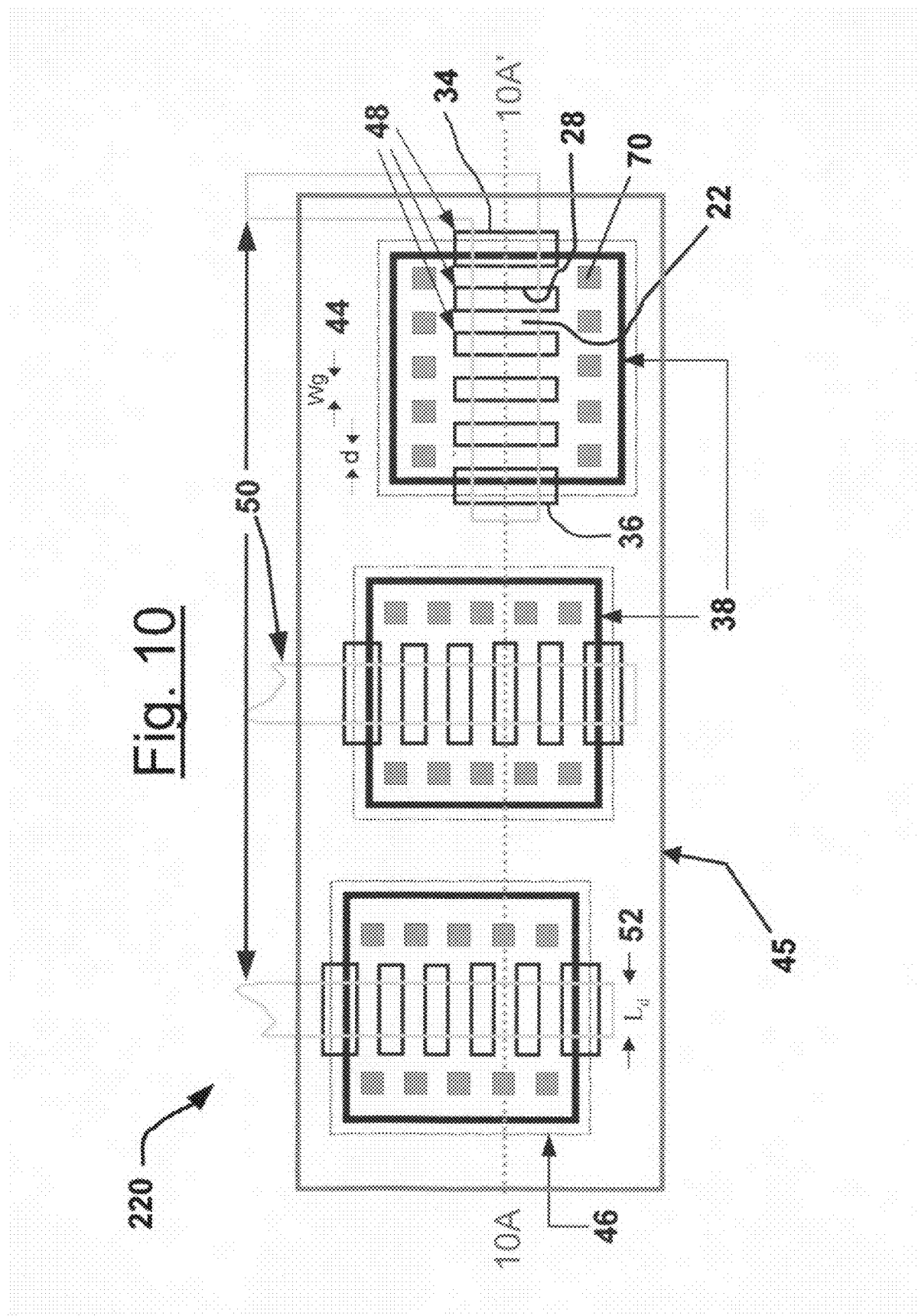
FIG. 10 is a top view including the photolithography masking elements of a ninth embodiment of the present invention, illustrating two similar orientations and one orientation 90° relative to the first two orientations to illustrate the complete structure of the embodiment.

Finally, FIGS. 10, 10A and 10B illustrate an embodiment 220 of the device of the present invention wherein predefined material regions 222, 223, 224 have been incorporated into the starting substrate or wafer 221 prior to the deposition of the device structure. As can be seen from FIG. 10A, the device 220 is substantially deposed within a space that encompasses a first material region 222, although the lower portions 62, 64 of dual-polarity source and drain regions 24, 26, respectively, can be seen to overlap slightly into a second material region 223. In many cases, the material of the first predefined region 222 will be semiconducting of a first polarity, with upper portions 58, 60 of dual polarity source and drain 24, 26, respectively, being degenerately counter-doped sub-regions of first material region 222 but having a second polarity. As seen in earlier embodiments, lower source and drain portions 62, 64 will be of the same polarity as the vertical channel regions 22, but at a substantially higher doping concentration. In the specific embodiment of FIGS. 10-10A, the device 220 has been deposed onto starting substrate 221 in such a way as to create a common connection 222' between the vertical channel elements. This common connection 222' is analogous to the common connection 81 of the device embodiment 78 of FIGS. 5-5A.

As described above, the device of the invention may be deposed upon a starting wafer that is comprised of predefined regions of differing material types, wherein each material type may be conducting, non-conducting (including insulating), or semiconducting. Additionally, the device may be deposed within the starting wafer so that it may reside entirely within a first predefined region of the wafer, or within a space that comprises more than one predefined region.

As now shown in FIGS. 10 and 10B, the photolithography mask layers of the device 220 of the present invention are substantially the same as earlier embodiments 20, 72, 78, 202, 204, and 210, but with an additional mask layer 45. Mask layer 45 defines the material regions 222, 223, 224 within the starting substrate 221, and thereby aligns those predefined regions to the device embodiment of the present invention. Alternately, the mask layer 45 of device embodiment 220 may be omitted, and alignment of the device to the predefined regions 222, 223, 224 may proceed using other techniques known in the art.

The engineered starting substrate wafers 21 and 221 may include, but are not limited to, bulk, epitaxial, or bonded silicon wafers. The substrates may additionally include engineered substrates containing strained silicon layers and/or silicon-germanium heterostructures as well as material systems other than silicon, including Silicon Carbide (SiC), Gallium Nitride (GaN), Gallium Arsenide (GaAs), and Indium Phosphide (InP), which structurally may be epitaxial, bonded, or otherwise engineered. In addition, they may incorporate predefined regions of differing material types within which the device of the present invention is deposed. These predefined regions may be specified by a physical design lithography mask which is substantially incorporated with the physical design masks of the disclosed device. Alternately, the predefined regions may exist a priori, and the device of the disclosed invention is simply aligned and deposed within those regions using methods known in the art.

The improved DC drive current capability of the device of the present invention can be demonstrated by performing a $1^{st}$-order comparison with a planer MOS device of similar physical area for a given voltage supply level (Vdd). The composite DC electrical behavior of a device constructed in accordance with the present invention can be described using the basic structural representation illustrated in FIG. 11. As shown in the preferred case, a fully-depleted conducting pillar is formed of width (d), which is the separation of the gate-slot masks 48 of FIG. 3. The resulting element 22 in the preferred embodiment is essentially a single tri-gated Fin-FET. The gate-slot masks 48 are of width Wg and define gate conductors 30 which extend the previously mentioned second predetermined depth (z) into the silicon wafer 21. The electrical channel length of the resulting conducting element 22 is L. The resulting effective electrical "width" of a single element is $W_{pillar}=2z+d$, so it follows that the electrical width of a device with n elements will be $W_{elec}=n(2z+d)$. It should be noted that the segment defined by Wg does not contribute to conduction. The physical width of the device 20, i.e. the amount of linear wafer dimension, is $W_{lateral}=nd+(n+1)Wg$. As a first order approximation, the DC terminal characteristics of each pillar device will follow the "square-law" characteristic of a standard MOSFET [$Ids \cong \beta(Vgs-Vt)^2$].

The first-order "drivability" of a MOS device in saturation can be expressed as illustrated in equation (1) below.

$$Jds = \frac{Ids}{W_{lateral}} \cong \frac{\frac{1}{2}\mu_{eff}C_{ox}(W_{elec}/L_{elec}) \cdot V_{eff}^2}{W_{lateral}} \quad (1)$$

In this equation (1), $\mu_{eff}$ is the effective mobility, $W_{elec}$ is the electrical width, $L_{elec}$ is the electrical length, Veff is the overdrive voltage (Veff=Vgs−Vt), and Cox=∈r ∈0/tox. In comparing the FDCG MOS device to it's planer counterpart, the DC/low-frequency performance improvement can be defined as the ratio of the respective device "driveabilities" for a given gate oxide thickness (tox), or power supply level (Vdd) as indicated in equation (2) below.

$$P_{drv} = \frac{Jds|_{FDCG}}{Jds|_{planar}} \quad (2)$$

Figure 11:
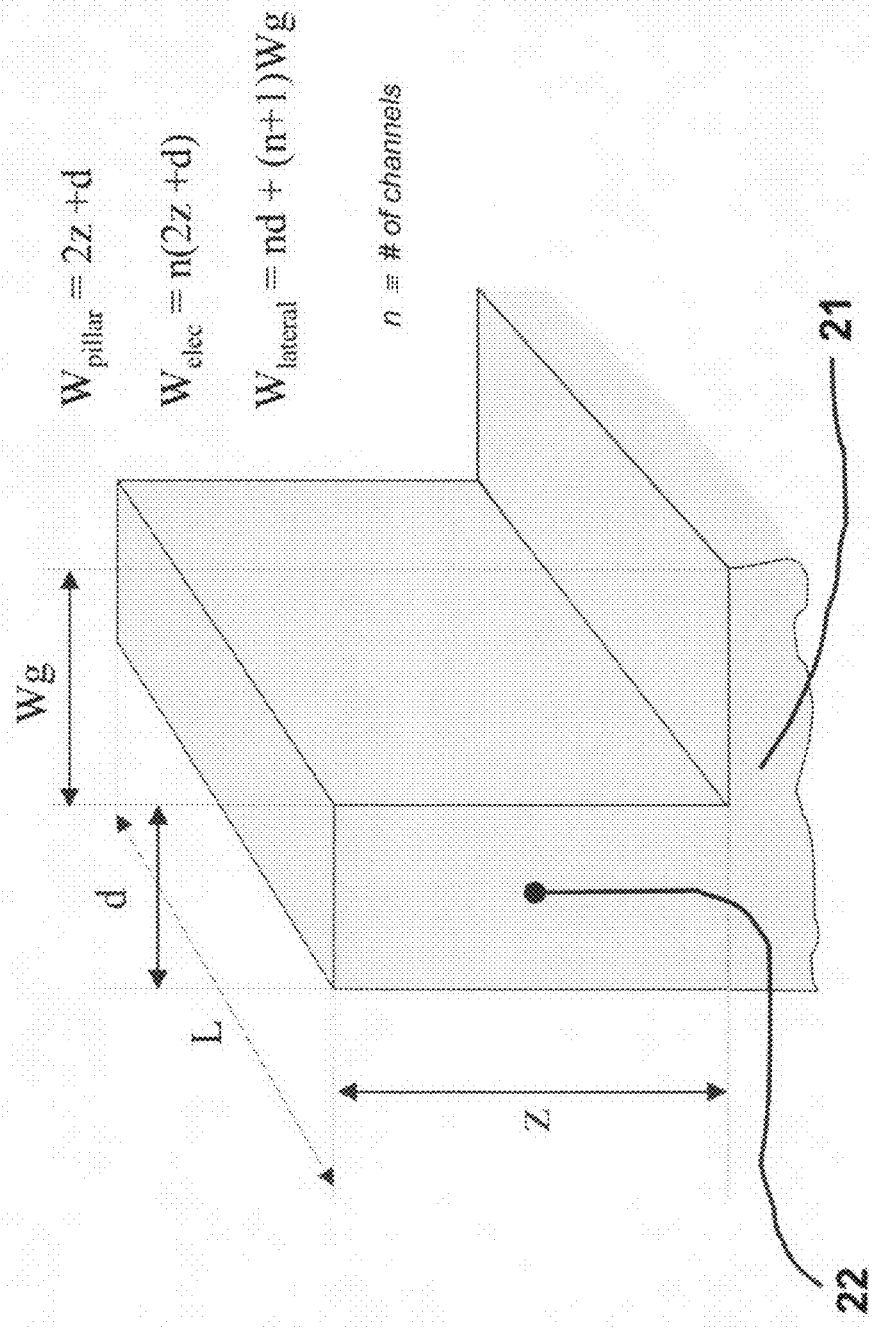
FIG. 11 is a structural representation illustrating the electrical behavior of a device constructed in accordance with the present invention.

From the definitions given with respect to FIG. 11 and the relation defined by Equation 2, the DC FDCG performance improvement for the tri-gated case can be expressed as follows in equation (3):

$$P_{drv}|_{TG} \cong \beta \frac{n(2z+d)}{nd+(n+1)W_g} \cdot \left(\frac{L_{min}|_{PSG}}{L_{min}|_{TG}}\right) \quad (3)$$

wherein $L_{eSG}$ and $L_{eDG}$ are the minimum channel lengths of a planer single-gate MOSFET and a vertical double-gated or tri-gated MOSFET, respectively. β represents the ratio of the double-gated and single-gated effective mobilities for a given threshold voltage, where 0.75<β<1.00. In the case where the gate slot separation (d) is increased to the point where fully-depleted device operation no longer occurs, the ($L_{eSG}/L_{eDG}$) term in Equation 3 approaches unity.

From Equation 3, a DC performance improvement can be projected in the range of $6.3 \times < P_{drv|TG} < 8.5 \times$ between the tri-gate FDCG device and its planar counterpart for a power supply level of 5-volts (tox=120A). This performance improvement increases to greater than 10× when the margin for short-channel effects affecting the device are relaxed to levels consistent with digital signal functions.

In terms of small-signal/AC behavior, the performance improvement of the FDCG MOS device of the present invention can be quantified by its Unity Gain Frequency, $f_T$. In the case of a MOSFET, the Unity Gain Frequency is defined as the frequency at which the small signal current gain of the device drops to unity, while the Source and Drain terminals are held at AC ground. For a MOSFET in saturation (single or double gate), the following mathematical relationship of equation (4) applies.

$$f_T = \frac{g_m}{2\pi \cdot C_{gs}} \cong \frac{\frac{3}{2}\mu_{eff}V_{eff}}{2\pi \cdot L_{eff}^2} \quad (4)$$

Equation 4 can be used to define a performance improvement metric, as was done for the dc "drivability" improvement. The resulting expression for AC performance improvement ($P_{ac}$) of a double or tri-gated FDCG device over its planer counterpart, for a constant power supply (tox), is as follows in equation 5.

$$P_{ac} = \frac{f_T|_{TG}}{f_T|_{PSG}} \cong \beta \cdot \left(\frac{L_{min}|_{PSG}}{L_{min}|_{TG}}\right)^2 \quad (5)$$

wherein $L_{eSG}$, $L_{eDG}$, and β are all as previously defined. From Equation 5 and available scaling data, the expected AC performance improvement of an FDCG device of the present invention is in the range of 3×-5× for the power supply levels of interest (2.5<Vdd<5.0). However, in the case of the devices of the embodiments 216 or 218, as illustrated in FIGS. 8-8A and FIGS. 9-9A, respectively, the AC performance improvement of the FDCG device will be substantially reduced from the prediction of Equation (5), since the overlap capacitance $C_{ov}$ is now comparable: to the gate capacitance $C_{gs}$, and the Unity Gain Frequency $f_T$ is as indicated in equation (6) below.

$$f_T \cong \frac{g_m}{2\pi \cdot (C_{gs} + C_{ov})} \quad (6)$$

Accordingly, it should also be noted that as a secondary effect of being able to achieve a target drive current with reduced linear wafer dimension ($W_{lat}$), the device of the present invention will have reduced junction capacitance for the same drive current as compared to its planer counterpart. In addition, since deep source/drain junctions are required for the operation of the device of the present invention, it will also have higher junction breakdown voltages as compared to a planer counterpart designed to operate at the same power supply voltage (Vdd). Additionally, for digital applications where the parasitic power loss at the junctions is proportional to ½$C_{diff}V^2$, and $C_{diff}$ is the junction capacitance, the parasitic power loss will be reduced by a factor of at least $1/P_{drv}$, for devices with large ($W_{elec}/L_{elec}$) drive ratios.

As mentioned earlier, because the device of the present invention is intended for use with comparably thick gate oxides (Tox>60 Å) and higher power supply voltages (Vdd>1.8 volts), it is also possible to realize good operating characteristics with a device constructed in accordance with the present invention without the use of exotic materials for the gate conductor and gate dielectric, as is common for prior art devices.

The foregoing description and the illustrative embodiments of the present invention have been described in detail in varying modifications and alternate embodiments. It should be understood, however, that the foregoing description of the present invention is exemplary only, and that the scope of the present invention is to be limited to the claims as interpreted in view of the prior art. Moreover, the invention illustratively disclosed herein suitably may be practiced in the absence of any element which is not specifically disclosed herein.

I claim:

1. A castellated-gate MOSFET device capable of fully depleted operation comprising:

a semiconductor substrate region having an upper portion with a top surface and a lower portion with a bottom surface, formed within a semiconductor wafer, said semiconductor wafer also having an upper portion with a top surface and a lower portion with a bottom surface;

a source region, a drain region, and a channel-forming region disposed between said source and drain regions, all of which are formed in said semiconductor substrate region;

trench isolation insulator islands surrounding said source and drain regions as well as said channel-forming region and having upper and lower surfaces;

said channel-forming region comprising a plurality of thin, spaced, vertically-orientated conductive channel elements that span longitudinally said gate elements extending to a depth greater than lower surface of said shallow trench isolation islands along said device between said source and drain regions;

a gate structure in the form of a plurality of spaced, castellated gate elements interposed longitudinally between and outside of said channel elements, and a top gate member interconnecting said gate elements at their upper vertical ends to cover said channel elements;

a dielectric layer separating said conductive channel elements from said gate structure;

a buried insulator structure having an upper portion with a top surface and a lower portion with a bottom surface;

said top surface of said buried insulator structure spaced below said lower surfaces of said trench isolation insulator islands; and said bottom surface of said buried insulator structure being coincident with said bottom surface of said semiconductor wafer.

2. The device as claimed in claim 1, wherein said source and drain regions of said device are preferably of dual-polarity, each being a composite of n-type and p-type dopant impurities.

3. The device as claimed in claim 2, wherein said source and drain regions are each dually doped to create said dual polarity, and wherein the dopant of said channel-forming region is of a first conductivity type, wherein the dopant of the upper portions of said source and drain regions is of a second conductivity type at a degenerate concentration, and wherein the dopant of the lower portions of said source and drain regions is of said first conductivity type but of an order of magnitude greater than the dopant level of said channel-forming region.

4. The device as claimed in claim 1, wherein said gate structure incorporates an insulating separating layer which is contiguous with, and substantially the same thickness as said dielectric layer.

5. The device as claimed in claim 1, wherein said buried insulator structure has a thickness greater than 1500 angstroms.

6. The device as claimed in claim 1, wherein said device provides robust analog, mixed-signal, and I/O applications.

7. The device as claimed in claim 1, wherein said gate elements include a bottom gate dielectric, said bottom gate dielectric having a thickness equal to, or greater than said dielectric separating layer.

* * * * *